United States Patent [19]
Marks

[11] Patent Number: 5,229,624
[45] Date of Patent: Jul. 20, 1993

[54] LIGHT-POLARIZING ELECTRICALLY-CONDUCTING FILM

[76] Inventor: Alvin M. Marks, Bigelow Rd., Athol, Mass. 01331

[21] Appl. No.: 591,051

[22] Filed: Oct. 1, 1990

[51] Int. Cl.⁵ .............................................. H01L 27/14
[52] U.S. Cl. ...................... 257/40; 257/443; 257/448; 257/465; 257/103; 136/263; 136/257
[58] Field of Search ............. 357/8, 12, 68, 30 B, 357/30 Q, 30 R, 30 P, 19, 4; 136/263, 257; 257/40, 443, 448, 465, 103

[56] References Cited

U.S. PATENT DOCUMENTS 4,574,161 3/1986 Marks .............................. 357/8 X

FOREIGN PATENT DOCUMENTS 56-130976 10/1981 Japan ............................. 357/8 X
62-222669 9/1987 Japan ............................. 357/8 X
2-001168 1/1990 Japan ............................. 357/8 X Primary Examiner—William Mintel

[57] ABSTRACT

A new composition of matter is described comprising a stretch oriented electrically-conducting light-polarizing film. An improved light-electric power converting film uses molecular diodes (diads) in this film composition aligned head-to-tail by light and an electric field. The area of the film is utilized more efficiently by reversing the head-to-tail directions of the diads in adjacent areas. This film is laminated to an electrode structure connected to busbars on a substrate sheet. Current flow through the film is unidirectional between pairs of adjacent electrodes, and is summed on busbars connected to an external load. Two such films arranged orthogonally convert about 72% of the incident light power to electric power. A manufacturing device is disclosed. Critical Ranges of parameters are derived and experimental data presented.

19 Claims, 7 Drawing Sheets

LIGHT-POLARIZING ELECTRICALLY-CONDUCTING FILM

RELATED U.S. PATENTS

Related U.S. Application Data cited in U.S. Pat. No. 4,574,161 issued Mar. 4, 1986 to Alvin M. Marks, filed Sep. 14, 1984, Ser. No. 650,708, and subject matter of said patent, is included herein by reference.

FIELD OF THE INVENTION

The field of this invention relates to: a polymeric light-electric power converting sheet comprising molecular antennae, diodes and electrode structure; a method, and a device for its manufacture.

DEFINITIONS

Heteromonomer: A monomeric unit comprising various different structures chemically bonded to each other on a particular order.

Lepcomer: A heteromonomeric molecular unit which is capable of absorbing a photon, and converting the photon energy to an increase in electric energy by motion of an electron charge in one direction toward one end of the molecule.

Lepcopolymer: A polymer chain comprising linked lepcomer units which is capable of absorbing one or more photons, and converting the photon energy to an increase in electric energy by a motion of electron charges in one direction. The linkage may be by chemical bond, or by proximity.

Lepcon ™ A trademark* referring to a light electric power converter.
(* The Trademarks are owned by the Inventor and the Marks-Aitken Children's Trust 50/50)

Lumeloid ™ A trademark* referring to a light electric power converter which comprises a lepcopolymeric sheet.
(* The Trademarks are owned by the Inventor and the Marks-Aitken Children's Trust 50/50)

Diad: An electrical diode of molecular dimensions in which an electron can travel in only one direction. It comprises a substantially linear molecular complex containing groups of atoms specialized as an electron-donor group, an insulator-spacer group, and an electron-acceptor group. An electron from the donor can tunnel across the insulating spacer to the acceptor, but not in the reverse direction.

Diad-Dipole: A diad in which an electron has moved to one end of the diad, due to absorbing a photon of light. A diad-dipole in a suitable fluid is an electric dipole on which an electric field exerts a torque, rotating its long axis parallel to the field, and the negative end toward the positive electrode. In this manner, diad-dipoles are aligned head-to-tail.

BRIEF DESCRIPTION OF THE FIGURES

FIG. 6 is the electrical load, FIG. 7 is current, FIG. 8 is generated voltage, and FIG. 9 is internal resistance.

DESCRIPTION OF THE INVENTION

Figure 1:
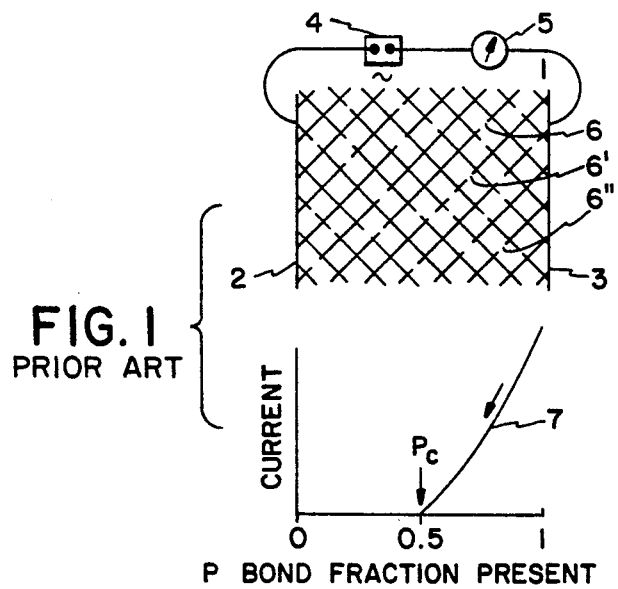
FIG. 1 shows a diagram of a randomly connected network according to the prior art.

A prior art reference [12] describes "percolation theory", relating to fluid or electric current flow through a random network; such as shown in FIG. 1, comprising a 2 dimensional square resistive wire lattice 1 connected between bus bars 2 and 3. The busbars 2 and 3 are connected to a voltage source 4 and ammeter 5. The wire lattice has been cut at random in many places; for example at positions 6, 6', 6", . . . ; a fraction p of the connections between the wires remains uncut. The graph 7 below the lattice shows current vs. p. The current flow is the same in both directions. For this 2 D lattice, the critical value of p is: $p_c = 0.5$. For values of $p > 0.5$, the current increases rapidly with p; for values of $p < 0.5$ the current is zero.

Figure 2:
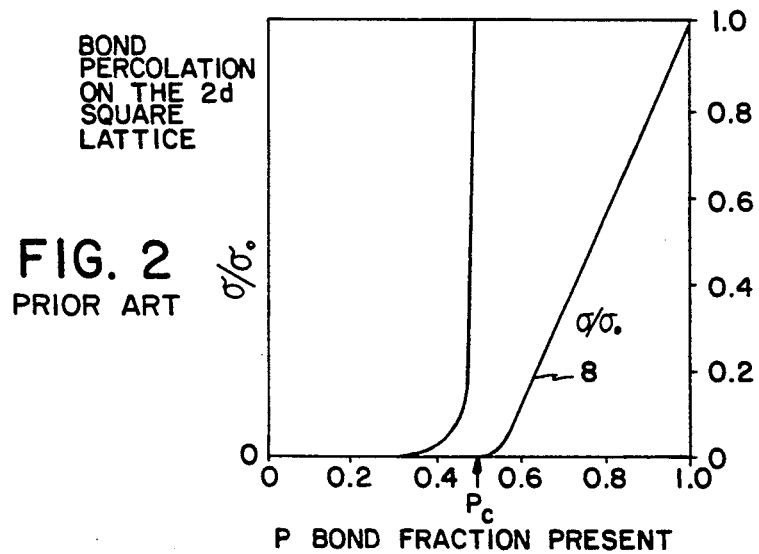
FIG. 2 shows for a random network, a graph of the proportion of gaps in which connections have been made versus the conductivity of the network, according to the prior art.

FIG. 2 shows the curve 7 for the conductivity ratio $\sigma/\sigma_o$ vs. p is zero for $p < p_c$; but increases rapidly for $p > p_c$.

Figure 3:
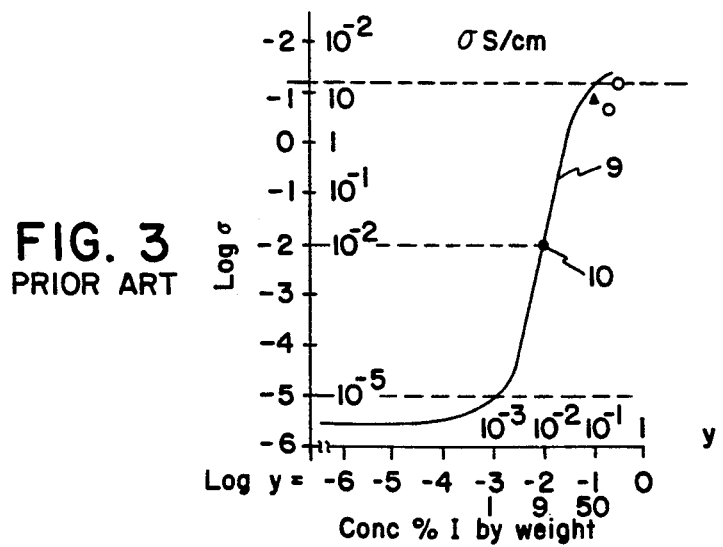
FIG. 3 shows experimental values of conductivity versus the molar percentage of Iodine in transpolyacetylene reported in the prior art. The Percentage of Mass Concentration of Iodine has been calculated and is shown on the same graph.

FIG. 3 shows prior art experimental data for Polyacetylene doped with Iodine [13]. The data are for bundles of fibrils of polyacetylene aligned by stretching, in a sheet which is black, opaque and not optically continuous; and which scatters and absorbs incident light. Nevertheless the data is useful. The curve 9 shows log $\sigma$ vs log y; and log C; where $\sigma$ is the Conductivity of the doped polyacetylene; y is the mol fraction of iodine, and C is the weight fraction of iodine in the polymer. The midpoint 10 on the curve 9, is at coordinates log $\sigma$, log $y_o$; or, log $C_o$. The significance of the curve and its midpoint is explained below in the description of FIG. 5.

Figure 4:
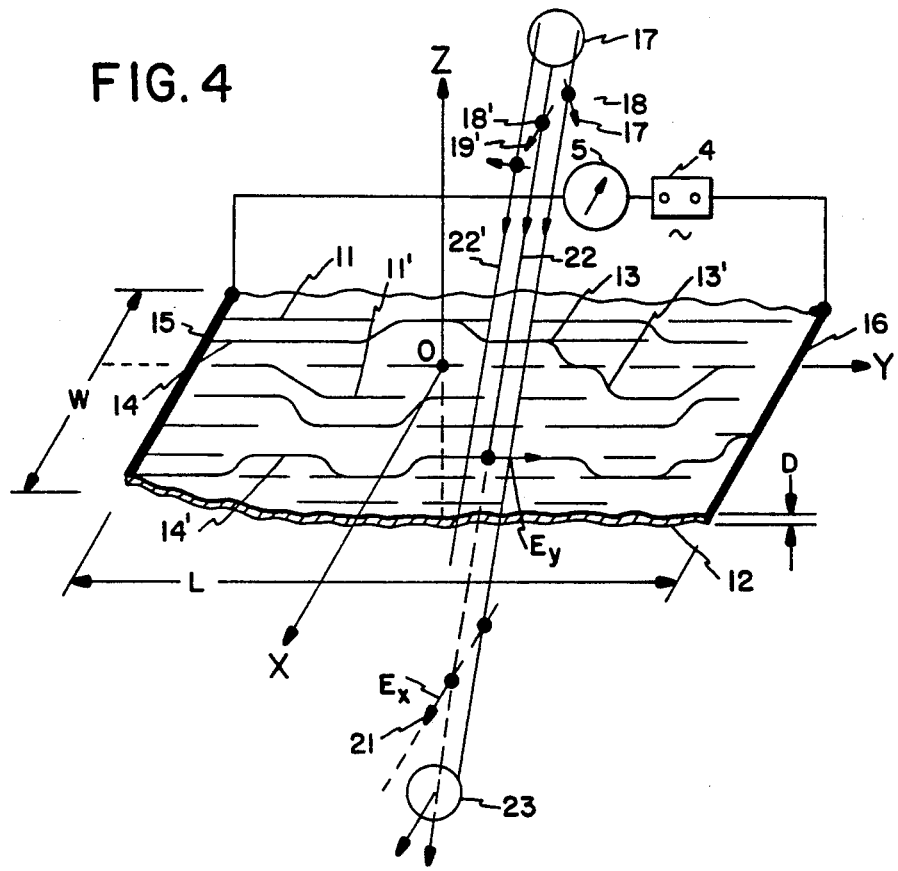
FIG. 4 shows a random network with parallel linear conductors with incident random photons and transmitted polarized protons.

Referring to FIG. 4, the sheet 12 is an electrical conductor and a light polarizer. In the sheet 12, linear conductors 11, 11', . . . which may comprise lengths of linear conducting molecular chains are disposed at random substantially parallel to the OY axis, supported in the transparent matrix sheet 12. The linear conductors 11, are long and thin and may wander somewhat from being parallel, enabling contact with other linear conductors displaced a small distance $\pm\delta x$ and $\pm\delta z$ along the OX axis, in zigzag connections 13,13' . . . ; thus providing a few or many connecting paths 14, 14' . . . between the electrodes 15,16. The voltage source 4 may be AC or DC. The current flow, which may be measured by ammeter 5, is the same in both directions. Light source 17 emits light photons 18, 18', . . . in a light beam having rays 22, 22' . . . , which are incident on the sheet 12. The electric vectors 19,19' of the photons 18, 18' are normal to the incident light rays, and disposed at random angles about the rays. The sheet 12 has a length L between electrodes 15 and 16, and width W parallel to the electrodes; the area exposed to light is A=LW. A transmitted beam 23 is strongly polarized along a vector 21.

Figure 5:
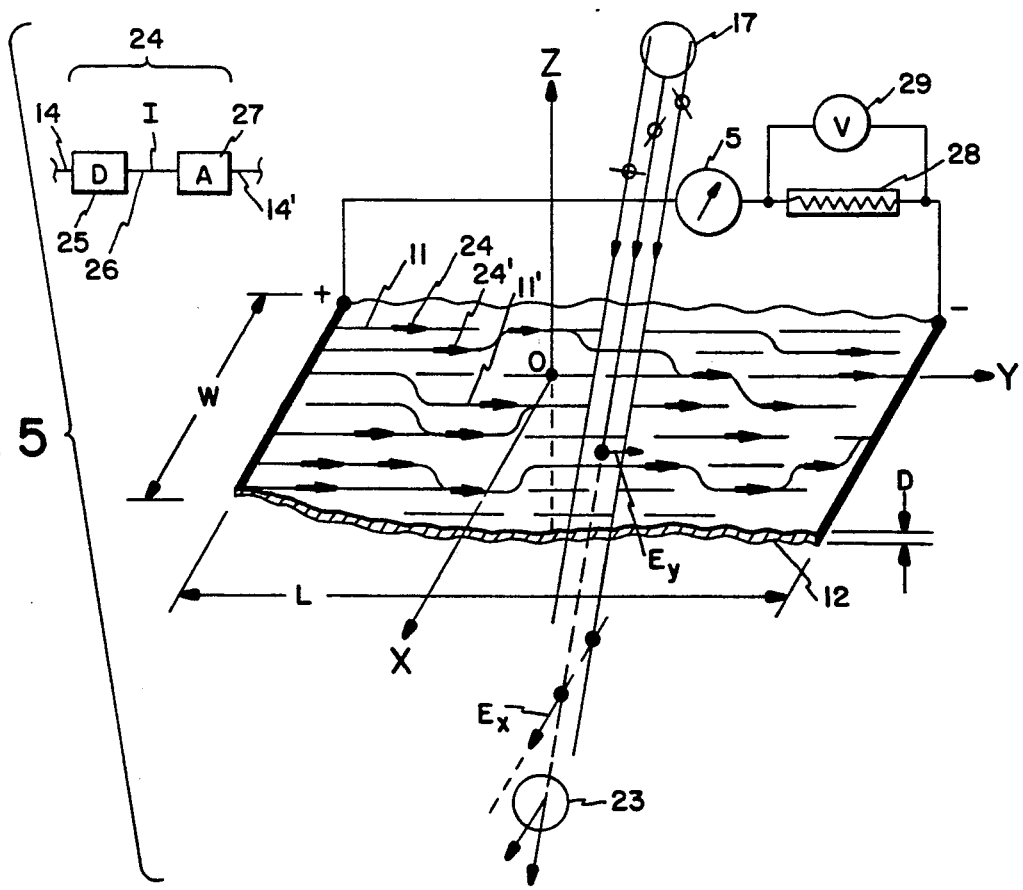
FIG. 5 shows a randomly connected network sheet with oriented diodes at a proportion of connections.
Figure 6:
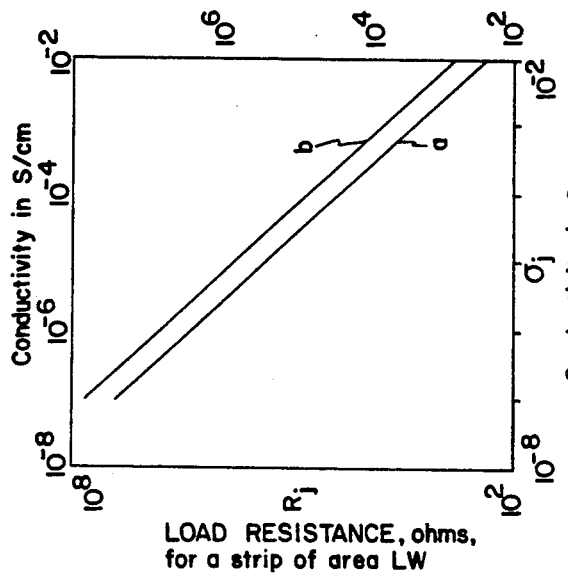
FIGS. 6-9 inclusive use a mathematical model of a light-electric power converting sheet according to this invention to compute an example of the relationships between the electrical variables with $\sigma$ the conductivity as the major parameter; showing log log graphs of the $\sigma$ the conductivity in S/cm versus respectively.
Figure 7:
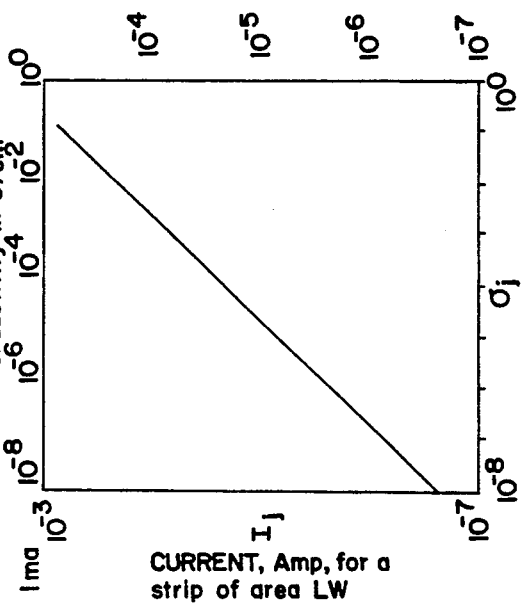
Figure 9:
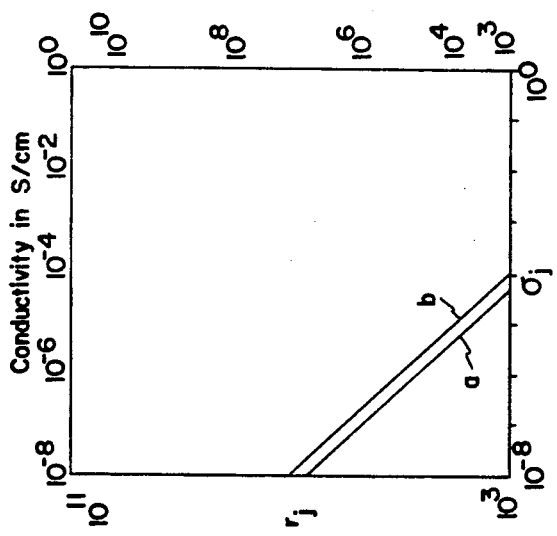
Figure 8:
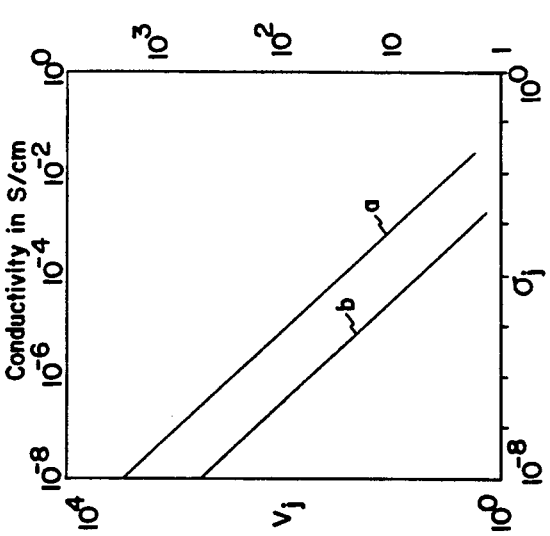

FIG. 5 is the same as FIG. 4 except that it is a light-electric power converting sheet containing molecular diodes, or diads 24,24' . . . dissolved in the composition and aligned head-to-tail as indicated by the arrows. A molecular diode, also known as a "diad" is a donor-insulator-acceptor complex. A Diad 24 is illustrated diagrammatically in the upper left portion of FIG. 5. It comprises a donor molecule 25, an insulating spacer molecule 26, and an acceptor molecule 27. Diads are usually rigid elongated molecules. When a diad is exposed to light it may absorb a photon, the photon energy is transferred to an electron which is moved to one end of the diad, to a higher electric potential, thus producing an electrical dipole. The functions of the diads 24,24' . . . are: to transmit an electron charge in one direction only; and, to provide an insulating barrier for the potential difference between adjacent linear conducting chains. The insulating spacer molecule 26 provides a tunnel junction between the donor molecule 25 and the acceptor molecules 27; the diad as a whole functions as a molecular diode. The molecular diodes 24, 24' . . . function as one-way connectors between the linear conducting molecules.

Figure 12:
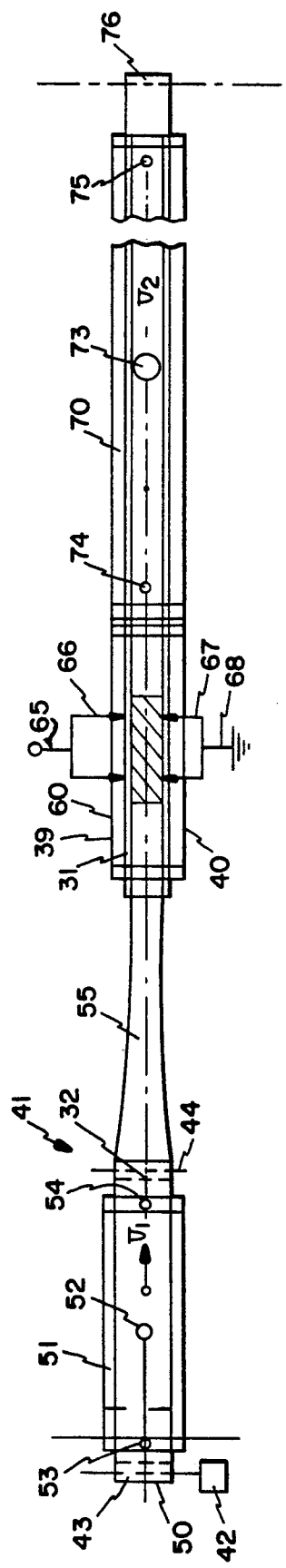
FIG. 12 shows a diagrammatic plan view view of a production device for the continuous manufacture of light electric power converting sheets according to this invention.
Figure 13:
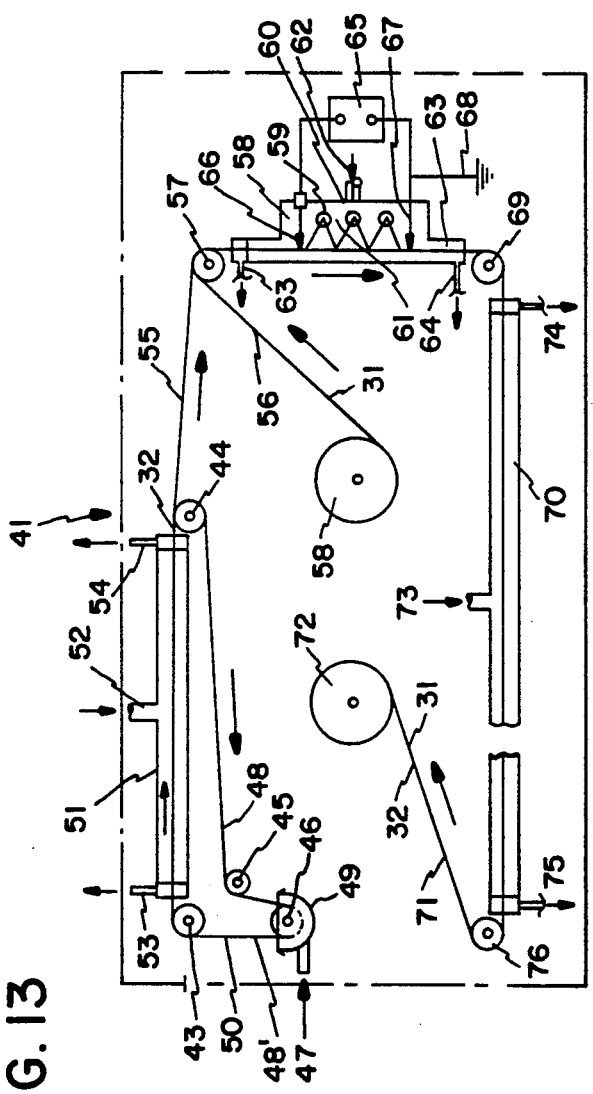
FIG. 13 shows a diagrammatic side sectional view through the YOZ plane of a production device for the continuous manufacture of light electric power converting sheets according to this invention.

During the process of manufacture described in FIGS. 12 and 13, just after the stretching step, enough solvent remains in the film to permit the diad to rotate. An electric field applied between the electrodes 15,16 produces torques on the diad dipoles 24,24' . . . rotating them into a head-to tail configuration. In FIG. 5, the diad 24 comprises a donor molecule 25, an insulator molecule 26 and an acceptor molecule 27. The insulator molecule 26 is a short nonconducting linear molecular chain. The chemical composition of the insulating spacer molecule 26 may be, for example, a linear polyalkyl chain —$(CH_2)_x$—, where $3 > x > 15$; the length of the insulator chain is chosen to facilitate the tunnelling of the electron in substantially one direction only; the length of the insulating spacer molecule 26, or the spacing between the donor molecule 25 and the acceptor molecule is about 5 to 25 A. The voltage buildup between electrodes 15,16 across the load resistance 28 is a dynamic process. An incident photon 18 causes an electron in the linear conductor 11 between diads 24,24' to increase its voltage potential. This happens because the absorbed photon 18 increases the orbital energy of the linear conductor 11 by about 2.5 eV. As a result, the molecular orbital in the conductive antenna chain, usually a conjugated carbon chain, goes from a $\pi$ orbital to a $\pi^*$ orbital. This energy can be transmitted only in one direction through an adjacent diad to the next antenna. For less than a saturation flux of photons, there may be numerous antenna-diads at zero potential, because no photon had arrived to excite it to an increased potential. The potentials in adjacent antenna-diads are additive in voltage steps. Hence the potential difference between electrodes 15,16 depends on the photo flux time-rate of charge production on the series antenna-diads which induces a voltage between the electrodes; vs. the current, or time-rate of charge flow, drawn by the load 28. The voltage generated, as measured by a voltmeter 29 in parallel with the load 28 is the sum of all the voltages generated by the series antenna-diads. This depends on the dynamic balance of the rate of charge production by the incident photons absorbed by the antenna-diads, and the rate of charge removal by current through the load. When a photon flux pulse is applied the voltage between the electrodes 15,16 builds up exponentially. When the photon flux pulse suddenly drops to zero the voltage across the electrodes decreases exponentially to zero. The peak voltage generated across the electrodes 15, 16 is less than the maximum voltage generated by the saturation flux. With a saturation photon flux the voltage generated between the electrode is proportional to the number of diads between the electrode times the voltage generated per photon absorbed by each antenna-diad.

Returning to FIGS. 1,2, and 3, and more particularly the significance of point 10 on Curve 9 in FIG. 3, assume that most of the cut connections 6,6',6" . . . in FIG. 1 are replaced by diodes such as 24,24', . . . For the forward current the diad acts like a good connection, hence the bond fraction p and $\sigma$ the conductivity are increased; vice versa, for the reverse current the diad acts like a cut or open connection, hence the bond fraction p and the conductivity $\sigma$ are decreased. Further, because the linear conductors 11,11'. . . in FIG. 5 are oriented in one dimension, instead of in 2 dimensions as in FIG. 1, the curve 9 in FIG. 3 is shifted to the left of the curve 8 in FIG. 2, and the system is more sensitive to small changes in composition; specifically in this case, the % Concentration of Iodine.

The graphs shown in FIGS. 6-9, inclusive, were plotted from equations derived in Section 07.1, utilizing reasonable physical values given in the example; for distances between the electrodes 15,16 L=10, 100, 1000 $\mu$m; a unit width W=1 m; and film thicknesses D=2, 8, and 8 $\mu$m; respectively. Only the calculation for L=100 $\mu$m is given herein; other calculations are readily made with the same formula. The central parameter is the forward conductance of the film. Equations are derived in Section 07.1 utilizing this parameter to compute corresponding values of V the voltage across the electrodes; I, the current per strip of film between the electrodes, R the Load Resistance, $r_1$ the forward film resistance per strip; and $r_2$ the reverse film resistance per strip.

The Design Criteria utilized were:
1. the forward resistance $r_1$ of the film is negligable compared to the load; for example, $r_1 = 0.02$ R; and
2. the reverse resistance $r_2$ of the film is large compared to the load; for example, $r_2 = 50$ R; and 3. The Electric Field strength V/L between electrodes is less than the Electric Field strength between electrodes for spark breakdown in air $E = V_1/L$ Criteria 1, choosing L, W=1 m, D the known film thickness, and the forward conductivity $\sigma_1 = 5 \times 10^{-6}$ S/cm, enables calculations for a strip: Load Resistance R; voltage V; Current I; forward resistance $r_1$, and reverse resistance $r_2$. For these design values, and using respectively L=10, 100, 1000 μm; W=1 m, and D=2, 8, 8 μm; the calculated values of voltages are respectively: 1225, 125 and 25 volts.

Figure 10:
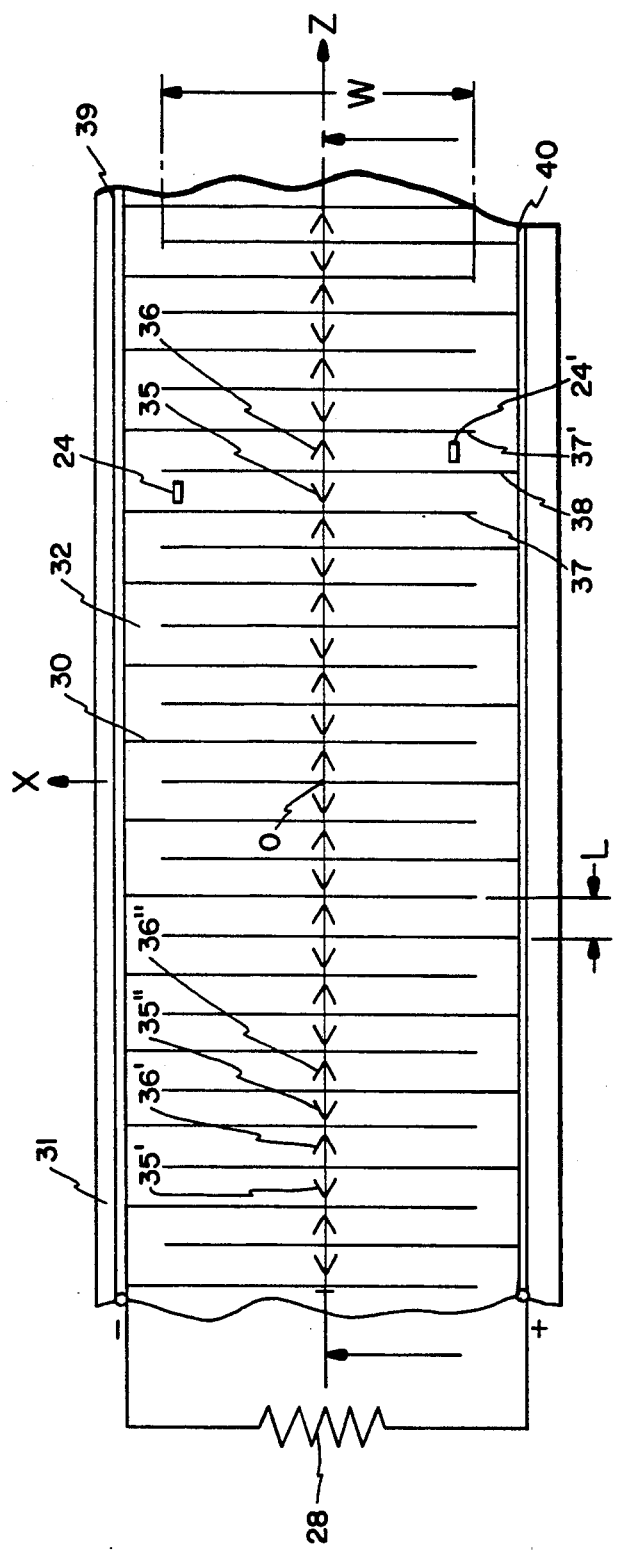
FIG. 10 shows a plan view in the XOZ plane, of a light/electric power converting sheet according to this invention.
Figure 11:
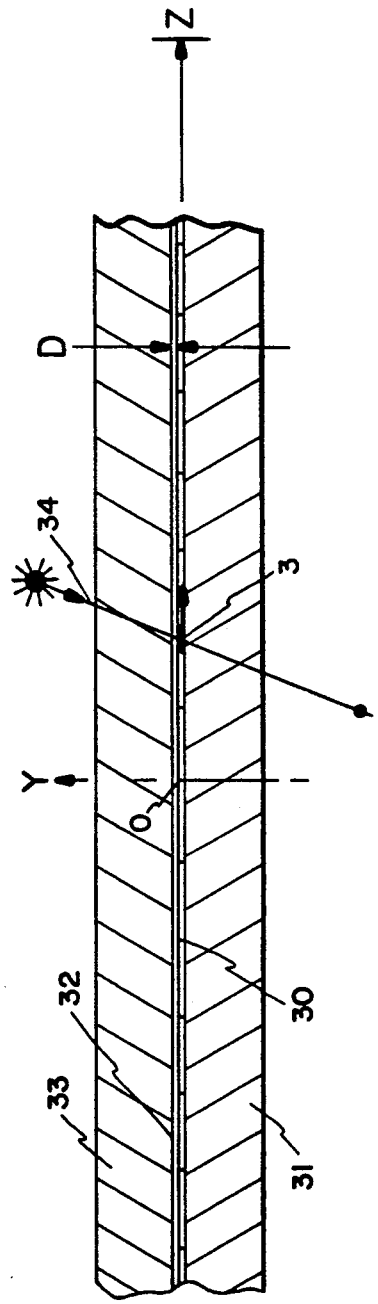
FIG. 11 shows a cross sectional view in the YOZ plane, of a light/electric power converting sheet according to this invention.

FIGS. 10 and 11 show a preferred embodiment of an electrode structure 30 on a substrate supporting sheet 31 in contact with a light-electric power converting polymeric film, or lepcopolymer film 32. A protecting cover sheet 33 may be laminated to the film 32. An example of the composition and manufacture of film 32 is described herein.

Referring to FIG. 10, OZ is the stretch axis of the film 32. Just after stretching, the film 32 is applied while partially fluid onto the support sheet 31. The molecular diodes or diads 24, 24' . . . are dissolved in the film composition 32 and are initially in random directions. During processing, the diad 24 is illuminated by light ray 34, and subjected to a strong electric fields: 35 and 36. The light ray 34 causes the electric charge in the molecular structure to flow toward one side of the diad, which becomes an electric dipole. The electric dipole is then oriented in a head-to-tail direction parallel to the stretch axis OZ by the applied electric field, in the −OZ direction by field 35; or in the +OZ direction by the field 36. For simplicity, only two diads are shown, but it is understood that there are many diads which are oriented head-to-tail as described. The head-to-tail directions of the diads are reversed in adjacent areas where the electric field directions reverse. The electric fields 35 and 36 are applied between electrodes 37-38 and 38 37', respectively. Busbars 39 and 40 are disposed parallel to the axis OZ, along the opposite edges of substrate sheet 31. Electrodes 37,37',37" . . . are connected to busbar 39; and electrodes 38, 38',38" . . . are connected to busbar 40. The advantage of this structure is that substantially all of the surface area of the lepcopolmer sheet 32 is utilizable for light-electric power conversion. In the prior art structure [b 1], the orientation of the diads were all in one direction, with an intermediate spaced area which served as an insulator, which could not be utilized for power conversion. The electrodes 37,37' . . . and 38,38' . . . and busbars 39,40 are deposited on the surface of substrate supporting sheet 31 by any suitable means, such as photolithography. The electrodes have a width $L_1$, and are spaced a distance L apart; and, $L_1 << L$; for example 2 μm and 100 μm respectively. The lepcopolymer film 32 has a thickness D usually from 2 μm to 10 μm. The active width of the sheet is W, herein taken as 1 m. Hence the active power converting area on the sheet between electrodes is A=LW.

The electric breakdown field strength in air is $E_1 = 3$ v/μm, or 300 v between electrodes 100 μm apart.

It is a feature of this invention to momentarily apply a much greater electric field strength between electrodes to align the diad-dipoles 24,24' . . . ; that is: $E_2 = 27$ v/μm or 2700 v between electrodes 100 μm apart. This is accomplished by using an atmosphere of Sulphur Hexafluoride, which is a harmless nontoxic gas. Sulphur Hexafluoride increases the electric field breakdown relative to air, by a factor of 9x; Since the aligning torque on the diad-dipole is proportional to E, the torque is increased by 9x.

A forward conductance of the film $\sigma_1 = 5$ E-6 S/cm is easily obtained with the light-polarizing electrically-conducting film composition described in Section 9.0. This value results in a generation voltage V less than the spark breakdown voltage in air: $V_1 = E$ $L = 3 \times 10^6$; which is, for L=10, 100, and 1000 μm; $V_1 = 30, 300,$ and 3000 volts, respectively. For comparison, the generated voltages between the electrodes are 25, 125, and 1225 voltage, respectively. The generated voltage V is less than the spark breakdown voltage in each instance. A smaller a value of forward conductivity of the film may result in spark breakdown. A further calculation shows that the minimum values of forward conductivity at incipient spark breakdown are, respectively:

$3.33 \times 10^{-6}, 8.33 \times 10^{-7},$ and $8.33 \times 10^{-7}$ S/cm

These values are all smaller than the chosen value of forward conductivity, i.e.: $5.0 \times 10^{-6}$ S/cm.

The continuous conversion of precursor polyvinyl alcohol (pva) film to a copolymer with polyvinylacetylene (pa), to make a light-polarizing electrically-conducting film and/or the light/electric converting film known as Lumeloid TM, requires a casting belt surface insoluble in the solvents and inert to the chemicals used in the composition, and stable to a temperature of at least 100° C. Mylar TM film (Dupont tm) is clear, transparent, and meets these requirements. Mylar film may be used for the casting belt. Mylar film may also be lithographed with conducting lines and busses, and used for the substrate film in a feed roll during manufacture.

The steps in the process for making a light-electric power converting polymer and substrate composite sheet are:
(i) Deposit a conducting line electrode structure on the film substrate; for example, by lithography; and wind on a roll for use in the manufacturing device described herein.
(ii) Prepare a polymer solution containing having a small proportion of medium boiling range residual solvent and diad material dissolved therein.
(iii) Cast the polymer solution (ii) onto a moving casting belt
(iv) Partially dry the solution (ii) to form a precursor film on the casting belt, and stretch orient the film onto the conducting line structure on the clear film substrate.
(v) Simultaneously illuminate the film (iv), and apply an electric voltage between the electrodes on the substrate to align the diads head-to-tail in the film.
(vi) Evaporate the residual solvent to fix the orientation of the diads.
(vi) Heat the film-substrate structure to a temperature and for a time sufficient to eliminate residual solvent.

FIG. 12 shows a linear layout on a plan view, and FIG. 13 a side view, of an example of a manufacturing device 41 for the continuous production of a light-electric power converting sheet according to this invention, illustrating the steps of manufacture. FIGS. 12 and 13 are approximately to a 1:100 scale. The manufacturing device 41 produces a light-electric power converting sheet ½ m (50 cm) wide. A chemically insert First Belt 48, such as Mylar, is mounted on Rollers 43, 44, 45, and 46. Variable Speed Motor 42 is connected to Roller 43, which drives the First Belt 48. The roller 46 is immersed in lepcopolymer solution 47 in the trough 49. The First Belt 48 is continuously passed through the fluid 47 in trough 49, and applied as coating 50 onto the belt surface 48'. The First Belt 48 moves with a velocity $U_1$. The coating 50 is partially dried; for example, at 50° C. for 6 min in a length of 6 m at a velocity of 1 m/min in a First Chamber 51, which has a hot air inlet 52, and air-vapor exhausts 53 and 54 at each end. The partially dried film 32 exits from the First Chamber 51 where the belt 48 turns around Roller 44. At this point the partially dry film 32 is pulled away from the belt 48 and stretched at location 55 onto the surface 56 of the Second Belt 31a at Roller 57. The Second Belt comprises a continuous substrate sheet 31 supplied from a wound Roll 58. The substrate sheet 31 has the electrodes 37,37' ..., 38,38' ..., and busbars 39 and 40 preformed thereon, as previously described in FIGS. 10 and 11. In this example, the coating velocity on the surface 48' of the First Belt 48 is $U_1=0.01667$ m/s (1 m/min; 60 m/hr), and the stretch ratio is 6 x. Then the velocity $U_2$ of the Second Belt 31a is:

$$U_2 \approx 6 \, U_1 \approx 0.1 \text{ m/s (6 m/min; 360 m/hr)}.$$

The initial width of the film on belt 48 is 1 m. After stretching at location 55, the film 32 is about $\frac{1}{2}$ its initial width, or $\frac{1}{2}$ m; with the same solid volume its thickness is about $\frac{1}{3}$ its initial thickness. After stretching film 32 onto sheet 31 at roller 57, the film composition retains enough solvent for the diad-dipoles 24,24' ... to rotate. It is a property of a diad that light causes an electron to move to one end of a diad, making it an electric dipole, herein termed a diad-dipole. An electric field exerts a torque on a diad-dipole. Consequently, diad-dipoles are rotated and aligned head-to-tail by the electric field, in a direction along the stretch axis. The Electric Fields 35,35' ..., 36,36' ... and Lights 59,59' ... are applied in a Second Chamber 60 for about 30 sec in a distance of 3 m. at a temperature of about 40° C. This step aligns the diad-dipoles and removes enough solvent from the film composition to permanently fix this alignment. A harmless nontoxic gas 61, sulphur hexafluoride $SF_6$ at 1 atmosphere pressure is provided in the Second Chamber 60. The $SF_6$ gas 61 enters the Second Chamber 60 via the Inlet Pipe 62 and exits via the Pipes 63 and 64 at each end. The presence of $SF_6$ gas enables a high electric breakdown field to be maintained without electric spark breakdown in the Second Chamber 60. The high electric breakdown field results in a maximum alignment of the diads. In the presence of $SF_6$ gas the maximum electric field is about 9 x, compared to that of the electric breakdown field in air (2700 v in sulphur hexafluoride compared to 300 v in air for a 100 $\mu$m distance between electrodes). The high electric field is applied by voltage source 65 via sliding contacts 66 and 67 made to busbars 39 and 40, respectively, on sheet 31.

Under the given conditions, the Second Chamber 60 has a total length of $(1+3+1)=5$ m. The purpose of an extra 1 m length at each end of the Second Chamber 60, is to prevent the momentarily applied high voltage from shorting out by sparking across the gap between the electrodes in the presence of air and damaging the film 32. To avoid this, one of the busbars 39 is disconnected periodically; for example, once for each meter length, by a break in its continuity while remaining protected by the presence of $SF_6$ in the Second Chamber 60. The other busbar is unbroken and remains connected to ground at 68. Subsequently, contacts along busbar 39 may be restored in any suitable manner.

The evaporation of the residual solvent in film 32 is accomplished by passing the film 32 on the substrate 31 through a Third Chamber 70, which is about 36 m long, for about 6 minutes at a temperature of about 85° C. with the velocity $U_2 \approx 6$ m/min. The completed sheet 71 is then wound into a roll 72; ready for use. A drying gas enters a centered inlet 73 and exits at end exhausts 74 and 75.

A light-polarizing electrically-conducting film made on manufacturing device 41 with a composition according to Example 1 in Section 08 herewith has a conductivity of about 1 E-4 S/cm. This composition may be diluted with an insulating polymer solution, such as polyvinyl alcohol in a water-alcohol solvent, to obtain a smaller conductivity such as 1 E-6 S/cm. It has a transmittance to ordinary light of 40 to 45%; to parallel polarized light of 80 to 90%, and to perpendicular polarized light less than 0.03%. A single such film with suitable diads is capable of a converting about 40% of incident light power to electric power. The transmitted component is polarized light comprising 40% of the incident light-power.

Figure 14:
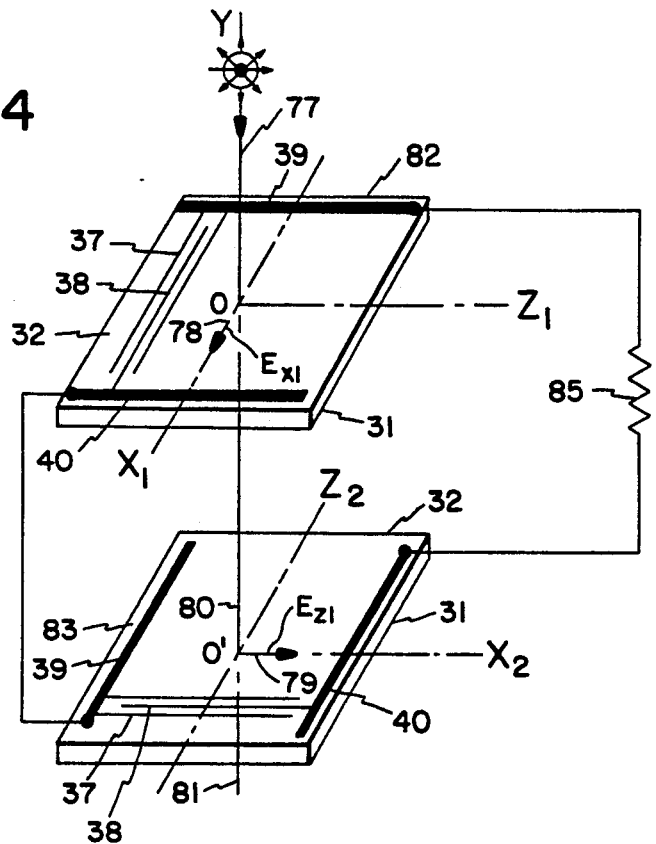
FIG. 14 is an exploded perspective view of an assembly for the conversion of light to electric power, showing a series connection to an electrical load.
Figure 15:
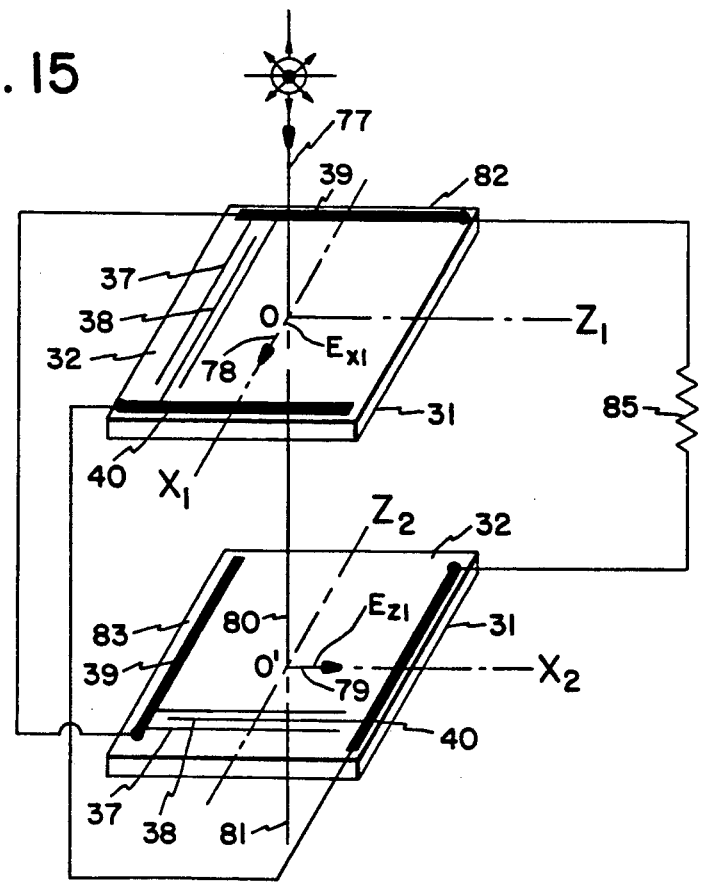
FIG. 15 is an exploded perspective view of an assembly for the conversion of light to electric power, showing a parallel connection to an electrical load.

FIGS. 14 and 15 are exploded perspective views of composite panel 84 comprising panels 82 and 83 laminated or assembled together with a single pair of electric outlet terminals connected to load 85. Panels 82 and 83 each comprise a lepcopolymer film 32 incorporating aligned diads mounted on a substrate supporting sheet 31 with electrodes and busbars, as above described. The XOZ planes of the panels 82 and 83 are normal to a common OY axis, and their axes $OZ_1$ and $OZ_2$ are disposed orthogonally.

Light-power Ray 77 along the OY axis may be incident on the First Panel 82. The electric vector $E_{Z1}$ of the resolved incident light 78, contains 50% of the incident light-power 77. The First Panel 82 converts 80% of the resolved incident light-power 78 to electric power. The First Panel 82 converts $50\% \times 0.8 = 40\%$ of the total incident light-power 77 to electric-power supplied to the load 85. About 80% of the remaining 50%, or 40% of the resolved incident light power 77 is transmitted as polarized light-power ray 79, having the electric vector $E_x = E_{Z2}$, which is incident on the Second Panel 83, which further converts 80% to electric power. Therefore $40\% \times 0.8 = 32\%$ of incident polarized light-power 79 is converted to electric power in the Second Panel 83. The total electric power converted by the two panels 83 and 84, connected in series or in parallel, is $40+32=72\%$.

If the peak sunlight power is 600 watts/m$^2$, then the peak converted electric-power supplied to the load 85 by the two panels is $600 \times 0.72 = 432$ watts/m$^2$. The daily available average incident sunlight power is about $\frac{1}{2}$ of peak, or 216 watts/m$^2$. The First Panel 82 converts 40% of $\frac{1}{2} \times 600$ peak power or 120 watts/m$^2$; the Second Panel 83 converts an additional $0.32 \times \frac{1}{2} \times 600 = 96$ watts/m$^2$; the total average electrical output power for the two panels is: $120+96=216$ watts/m$^2$.

Using two panels 83 and 84 of 1 m$^2$ area with the parallel electric connection shown in FIG. 15, the total generated electric power output is 432 watts/m$^2$; for electrode spacings $L=1000$, 100, and 10 $\mu$m, respectively, the voltages are 1225, 125, and 25 volts; the total currents are: 0.3527, 3.46, and 17.2 amp/m$^2$; and, the Load Resistances are: 3431, 36.1, and 1.45 ohms.

07.1 MATHEMATICAL PHYSICS OF LIGHT-ELECTRIC POWER CONVERSION PARAMETRIC EQUATIONS

I. SYMBOLS AND SELECTED NUMERIC VALUES $L := 100 \cdot 10^{-6}$ m length of film between electrodes
$W := 1$ m width of film
$D := 8 \cdot 10^{-6}$ m thickness of film
$\Gamma := 0.8$ light electric power conversion efficiency of single film; 0.5 max.; for which $\Gamma = 1$
$S_0 := 600$ w/m^2 Standard Sun Light Power per m^2
$x := 0.5$ Proportion of Standard Sun Light Power $0 > x > 1$ $\alpha := 0.02$ Ratio Internal Forward resistance r1 to Load Resistance R
$\beta := 50$ Ratio Internal Back Resistance r2 to Load Resistance R
$\sigma_1 := 5 \cdot 10^{-6}$ (ohm·cm) Forward Conductivity of Film
P watt Electric Power converted from light incident on film strip of area LW
R ohm Load Resistance for one film strip

II. EQUATIONS AND CALCULATIONS $$P := 0.5 \cdot \Gamma \cdot x \cdot S_0 \cdot W \cdot L \quad (1)$$

$P = 0.012$ watt  12 mw $$p := \frac{P}{W \cdot L} \quad (2)$$

$p = 120 \, \frac{\text{watt}}{m^2}$ $$R := \left[ \frac{.01}{\alpha \cdot \sigma_1} \right] \cdot \left[ \frac{L}{W \cdot D} \right] \quad (3)$$

The parametric equation for the load resistance is:

$$K_0 := \left[ \frac{.01 \cdot L}{\alpha \cdot W \cdot D} \right] \quad (4)$$

$K_0 = 6.25$ $R := K_0 \cdot \sigma_1^{-1} \quad (5)$ $R = 1.25 \cdot 10^6$ ohm $r_1 := \alpha \cdot R \quad (6)$ $r_1 = 2.5 \cdot 10^4$ ohm $r_2 := \beta \cdot R \quad (7)$ $r_2 = 6.25 \cdot 10^7$ ohm $$I := \left[ \frac{P}{R} \right]^{0.5} \quad (8)$$

$I = 9.798 \cdot 10^{-5}$ amp  98 μa per strip

From (1), (2) and (8) obtain the current I in terms of $\sigma_1$:

$$I := \left[ \frac{0.5 \cdot \Gamma \cdot x \cdot S_0 \cdot L \cdot W \cdot \alpha \cdot \sigma_1 \cdot W \cdot D}{.01 \cdot L} \right]^{0.5} \quad (9)$$

$I = 9.798 \cdot 10^{-5}$ same as (8)

There are 1/L strips per meter; i the current output per unit area is:

$$i := \frac{I}{L} \quad (10)$$

$i = 0.98 \, \frac{\text{amp}}{m^2}$

Simplifying (9):

$$I := W \cdot \left[ \frac{0.5 \cdot \Gamma \cdot x \cdot S_0 \cdot \alpha \cdot D}{.01} \right]^{0.5} \cdot \sigma_1^{0.5} \quad (11)$$

$$K_1 := W \cdot \left[ \frac{0.5 \cdot \Gamma \cdot x \cdot S_0 \cdot \alpha \cdot D}{.01} \right]^{0.5} \quad (12)$$

$K_1 = 0.044$

From (7) and (11) the Parametric Current Equation in terms of the Forward Conductivity is:

$I := K_1 \cdot \sigma_1^{0.5} \quad (13)$

As before, evaluating I:

$I = 9.798 \cdot 10^{-5}$ amp

Next obtain the Parametric Voltage Equation in terms of the forward Conductivity, from:

$V := (P \cdot R)^{0.5} \quad (14)$ $V = 122.474$ volt

From (1), (2) and (14):

$$V := \left[ \frac{0.5 \cdot \Gamma \cdot x \cdot S_0 \cdot W \cdot L \cdot .01 \cdot L}{\sigma_1 \cdot W \cdot D \cdot \alpha} \right]^{0.5} \quad (15)$$

Simplifying (15):

$$K_2 := L \cdot \left[ \frac{0.5 \cdot \Gamma \cdot x \cdot S_0 \cdot .01}{D \cdot \alpha} \right]^{0.5} \quad (16)$$

$K_2 = 0.274$ $V := K_2 \cdot [\sigma_1]^{-0.5} \quad (17)$ $V = 122.474$ volt

To plot Equations (5), (12) and (17) on a single log-log plot, rewrite in new forms:

$j := 0 \ldots 8$ (18)
$\sigma_j := 10^{-j}$ (19)
$R_j := K_0 \cdot [\sigma_j]^{-1}$ (20)
$I_j := K_1 \cdot [\sigma_j]^{0.5}$ (21)
$V_j := K_2 \cdot [\sigma_j]^{-0.5}$ (22)

From (1), (2) and (6):

$$K_3 := \alpha \cdot K_0 K_3 = 0.125 \quad (23)$$

$$r_j := K_3 \cdot [\sigma_j]^{-1} \quad (24)$$

$$E := 3 \cdot 10^6 \frac{\text{volt}}{m} \quad (25)$$

$$V_1 := E \cdot L \quad (26)$$

$$V_1 = 300 \text{ Breakdown Voltage across strip} \quad (27)$$

To avoid electrical breakdown, the minimum value of the conductivity $\sigma 3$ is from (15), (16), (25) and (26):

$$\sigma_3 := \frac{K_2^2}{V_1^2} \quad (28)$$

$$\sigma_3 = 8.333 \cdot 10^{-7} \text{ S/cm} \quad (29)$$

There are 1/L strips per meter length; hence the electric power output per unit area of the first sheet is:

$$P_1 := \frac{P}{L} \quad (30)$$

$$P_1 = 120 \text{ watt}$$

The current output per unit area of the first sheet is:

$$i = 0.98 \frac{\text{amp}}{m^2} \quad (31)$$

The Voltage Output from the first sheet; all strips in parallel:

$$v := \frac{P_1}{i} \quad (32)$$

$$v = 122.474 \text{ volt Same as (13)} \quad (33)$$

Comparing (26) and (33): note that $v < V_1$; hence, there will be no electric breakdown across the strip.

Electric power output per unit are for a pair comprising first and second sheets connected in parallel is derived:

The light power per unit area incident onto the first sheet is:

$$P_0 := x \cdot S_0 \quad \frac{\text{watt}}{m^2} \quad (34)$$

$$P_0 = 300$$

In the first sheet the incident light is resolved into equal orthogonal components. The light/electric power per unit area converted from one component by the first sheet is:

$$P_1 := 0.5 \cdot \Gamma \cdot x \cdot S_0 \quad \frac{\text{watt}}{m^2} \quad (35)$$

$$P_1 = 120$$

The light power per unit area transmitted through the first sheet and incident on the second sheet is also p1. The light/electric power per unit area converted in the second sheet is:

$$P_2 := \Gamma \cdot P_1 \quad \frac{\text{watt}}{m^2} \quad (36)$$

$$P_2 = 96$$

The total light electric power converted by the first and second sheets is:

$$P_3 := P_1 + P_2 \quad \frac{\text{watt}}{m^2} \quad (37)$$

$$P_3 = 216$$

The overall light electric power conversion efficiency is:

$$\Gamma_0 := 0.5 \cdot \Gamma \cdot (1 + \Gamma) \quad (38)$$

$$\Gamma_0 = 0.72$$

Equation (39) was derived from (37) and yields the same result:

$$\Gamma_0 := \frac{P_3}{P_0} \quad (39)$$

$$\frac{P_3}{P_0} = 0.72$$

For $\Gamma = 0.9$ the overall efficiency is, from (38) 85.5% Limits on the value of $\sigma 3$ may be determined from (15) and (28):

$$K_4 := 5 \cdot 10^{-3} \cdot x \cdot S_0 \cdot \frac{0.8}{E^2} \quad (40)$$

$$K_4 = 1.333 \cdot 10^{-13}$$

$$\sigma_3 := \frac{K_4}{D \cdot \alpha} \quad (41)$$

$$\sigma_3 = 8.333 \cdot 10^{-7} \text{ S/cm}$$

CONCLUSIONS

1. The largest values of D and $\alpha$ that are physically likely be employed, are respectively D=25 $\mu$m, and $\alpha = 200$; that is 12.5X and 4X greater than the values used for the calculation herein; hence, from (41), the smallest lower value of $\sigma 3$ is 6.66 E-8 S/cm.

2. The smallest values of D and $\alpha$ that are physically likely to be employed are D=1 $\mu$m and $\alpha = 5$; that is: 0.5X and 0.1X smaller than the values used for the calculation herein; hence, from (41), the greatest lower value of $\sigma 3$ is 6.66 E-5 S/cm.

07.2 MATHEMATICAL PHYSICS OF LUMELOID tm FILM

I. OBJECTS

1. To establish for a Lumeloid tm film (1), the relationships of the parameters, and useful ranges of values, for efficient light/electric power conversion.

2. To determine the light/electric power characteristics of a Lumeloid tm film as a function of the input light power, film resistivity, the dimensions of the film, and the dimensions of the lepcorner.

II. ASSUMPTIONS

1. The selected Numerical Values.
2. The output voltage is near breakdown in air 3. The forward internal resistance of the film r1, is small, and the back resistance r2 of the film is large, compared to the load resistance R, by ratios >50.

4. A linear Lepcomer molecule has a photon/electron interaction cross section comparable to an antenna. That is, its photon absorption cross section is greater than its physical cross section. In antenna theory the photon absorption cross section is about 8 times the physical area of the antenna (25). For almost complete absorption of polarized photons, previous experimental work on polarizing films (11) shows the polymeric linear conductor (Polyiodine in polarizing films) comprises about 20% of the mass of total polymer linear conductor; hence (1/F)=5. The same factor was found for high conductivity in conductive Polymers. (14)

III. SYMBOLS

| | | |
|---|---|---|
| A | m^ | Surface Area of Film |
| A0 | m^2 | Surface Area of linear Lepcomer molecule |
| a | m^2 | Cross sectional Area of film |
| a0 | m^2 | Cross Sectional Area of a Lepcomer molecule |
| D | m | Thickness of film |
| E | joule | Energy of the photon |
| E0 | volt/m | Electric Field Intensity |
| F | | Volume Fraction of Lepcomer molecules |
| f | Hz | Frequency of the photon |
| I | amp | Electric Current in a strip of Width W |
| i | amp | Electric Current in a line of Lepcomer molecules |
| L | m | Length of film strip |
| L0 | m | Wavelength of a photon |
| α | m | Length of conducting chain + diad molecule |
| β | m | Length of conducting chain |
| δ | m | Length of diad molecule |
| N | | Number of lines of Linear Lepcomer molecules in film cross section a |
| n | | Number of Lepcomer linear molecules in volume v |
| P | watt | Electric Power from strip of area A |
| R | ohm | Load Resistance |
| r | ohm | Internal Resistance; sub 1 forward; sub 2 back |
| S | watts | Light Power incident on Area A |
| u | m^2 | Cross Sectional Area of Lepcomer |
| v | m^3 | Volume of the film strip |
| w | m | Width of each Lepcomer Molecule |
| μ | m^3 | Volume of each lepcomer molecule |
| W | m | Width of the film strip |
| φ | photons/sec-m^2 | Sun Light Power Incident on a Unit Area of Lumeloid tm film. |
| θ | photons/sec | sunlight on area A |
| γ | photons/sec | sunlight on each lepcomer molecule |
| r | | Light/Electric Power Conversion Efficiency of Single Film in Sunlight |

III. NATURAL CONSTANTS $c := 2.9979 \cdot 10^8 \frac{m}{sec}$ Velocity of Light $e := 1.60219 \cdot 10^{-19}$ coul Electron Charge $h := 6.6626 \cdot 10^{-34}$ joule · sec Planck's Constant

IV. NUMERICAL VALUES

| | | |
|---|---|---|
| $D := 7 \cdot 10^{-6}$ | m | Thickness of film strip |
| $L := 1 \cdot 10^{-3}$ | m | Length of film strip |
| $W := 5 \cdot 10^{-3}$ | m | Width of film strip |
| $E := 2.5\, e$ | joule | Energy/photon, corresponding to a wavelength of 0.5 μm |
| $F := 0.20$ | | Volume Concentration of Lepcomers |
| $w := 2 \cdot 10^{-10}$ | m | Width of Lepcomer molecule |
| $\alpha := 1 \cdot 10^{-6}$ | m | Length of lepcomer molecule |
| $\Gamma := 0.40$ | | Light/Electric Power Conversion |

*-continued*

| | |
|---|---|
| φ | Efficiency of a single film s^ −1 m^ −2 Photons/ sec m^2 sunlight ave energy about 2.5 eV per photon; 10^21 photons/sec m^2; 600 w/m^2 from 400 nm-800 nm |

V. EQUATIONS

Volume v of film strip of length L, width W, and thickness D:

$$v := W \cdot D \cdot L \quad (1)$$

$$v = 3.5 \cdot 10^{-11} \, m^3$$

Volume of a Lepcomer linear molecule:

$$\mu := \alpha \cdot w^2 \quad (2)$$

$$\mu = 4 \cdot 10^{-26} \, m^3$$

Surface Area of a Lepcomer molecule:

$$\alpha \cdot w = 2 \cdot 10^{-16} \, m^2 \quad (3)$$

Number of Lepcomer molecules in volume v:

$$n := F \cdot \frac{v}{\mu} \quad (4)$$

$$n = 1.75 \cdot 10^{14}$$

Number of lines of Lepcomer molecules in cross section of the film strip:

$$N := F \cdot \frac{W \cdot D}{w^2} \quad (5)$$

$$N = 1.75 \cdot 10^{11}$$

Light Power S incident on Area A=WL $$S := 600 \cdot W \cdot L$$

$$S = 0.003 \text{ watt} \quad (5)$$

The electric power output from film Area A is:

$$P := \Gamma \cdot S$$

$$P = 0.0012 \text{ watt}$$

Photons per sec on surface area A:

$$\theta := \frac{S}{E} \quad (7)$$

$$\theta = 7.4897 \cdot 10^{15} \, sec^{-1}$$

Photons/sec per unit area $$\frac{\theta}{W \cdot L} = 1.4979 \cdot 10^{21} \quad (8)$$

Photons/sec per lepcomer molecule:

$$\gamma := \frac{\theta}{n} \quad (9)$$

-continued $\gamma = 42.7986$

Photons/sec on each line of Lepcomer molecules in Length L:

$$\gamma \cdot \frac{L}{a} = 4.2799 \cdot 10^4 \quad (10)$$

Number of lines of Lepcomers in film strip:

$$N := F \cdot \frac{W \cdot D}{w^2} \quad (11)$$

$$N = 1.75 \cdot 10^{11}$$

The current generated in each line of lepcomer molecules is equal to the current generated in each lepcomer molecule, because the lepcomer molecules are in series:

$$i := \gamma \cdot e \quad (12)$$

$$i = 6.8571 \cdot 10^{-18} \text{ amp}$$

Total Current through the width W of strip:

$$I := \theta \cdot e \cdot \left[\frac{a}{L}\right] \quad (13)$$

$$I = 1.2 \cdot 10^{-6} \quad \text{amp (1.20 } \mu\text{a)}$$

The number of lines of lepcomer molecules, each carrying a current i, and totalling a current I for all the lines in parallel is:

$$N := \frac{I}{i} \quad (14)$$

$$N = 1.75 \cdot 10^{11}$$

This is the same result computed by equation (11).

The voltage generated in the distance L is the sum of the voltages generated by each lepcomer molecule in a line:

$$V := \left[\frac{E}{e}\right] \cdot \left[\frac{L}{a}\right] \quad (15)$$

$$V = 2.5 \cdot 10^3 \text{ volt}$$

The electric field intensity is:

$$E_0 := \frac{V}{L} \quad (16)$$

$$E_0 = 2.5 \cdot 10^6 \frac{\text{volt}}{\text{m}}$$

This is less than the electric field intensity a breakdown in air which is 3 E6 v/m External Load Resistance R:

$$R := \frac{V}{I} \quad (17)$$

$$R = 2.0833 \cdot 10^9 \text{ ohm}$$

Internal Forward Resistance of the film must be less than:

$$r_1 := \frac{R}{50} \quad (18)$$

$$r_1 = 4.1667 \cdot 10^7 \text{ ohm}$$

The Forward Conductivity of the film must be greater than:

$$\sigma_1 := 0.01 \cdot \frac{L}{W \cdot D \cdot r} \quad (19)$$

$$\sigma_1 = 6.8571 \cdot 10^{-6} \text{ ohm} \cdot \text{cm}^{-1}$$

Many conductive polymers including trans polyacetylene have greater a greater conductivity (4.1) than that computed by (19); so this value is attainable.

The back Conductivity of the film must be less than:

$$\sigma_2 := \frac{\sigma_1}{2500} \quad (20)$$

$$\sigma_2 = 2.7429 \cdot 10^{-9} \text{ ohm} \cdot \text{cm}^{-1}$$

The frequency of a photon having an energy of 2.5 eV is:

$$f := 2.5 \cdot \frac{e}{1h} \quad (21)$$

$$f = 6.0119 \cdot 10^{14} \; (\cdot \cdot 0.6 \text{ femto Hz})$$

The wavelength of this photon is:

$$L_0 := \frac{c}{f} \quad (22)$$

$$L_0 = 4.9866 \cdot 10^{-7} \text{ m} \; (\cdot \cdot 0.5 \; \mu\text{m})$$

08 DIAD ALIGNMENT

The head-to-tail alignment of molecular diodes or diads by light and an electric field was previously described. [1] The alignment of conductive dipoles suspended in an insulating fluid has also been described. [25]

1. An insulating fluid is necessary to align diad-dipoles. A conducting fluid has free ions which migrate in an electric field, and would shield a diad in the fluid from the field. With no field there is no torque and no dipole alignment. A low conductivity fluid of medium boiling point is preferred as a residual solvent or temporary plasticizer in the lepcopolymer solution. Such fluids may initially comprise water, an alcohol and higher esters such as hexyl acetate or butyl lactate with a polymer such as polyvinyl acetate-alcohol copolymer or polyvinyl butyral [10], or a water-ethylene or propylene glycol fluid with polyvinyl alcohol polymer. During evaporation the lower boiling solvents which are electrically conducting are evaporated leaving the medium boiling nearly-insulating solvents substantially free of ions, enabling a high electric field to exist in the fluid to rotate the diad-dipoles. Subsequently, while the diads remain aligned by the field the residual solvent is evaporated, and after the diads are fixed in a head-to-tail position the field is removed.

2. To facilitate rapid and complete alignment of the diad-dipoles a maximum electric field intensity is applied; for example, using sulphur hexafluoride gas at one atmosphere.

3. A short rigid diad [2,21] rather than a longer more flexible diad in a lepcomer [22] is preferred because the former will rotate and align in a smaller electric field.

4. A lepcopolymer molecule may comprise a separate diad and linear conducting molecule antenna in proximity, but without actually touching or chemically combining with each other. An electron can tunnel between the separate but proximate aligned diad and conducting molecular chain, the combination functioning as a complete lepcopolymer. The diad may be a short linear molecule containing donor-acceptor molecules. [19]. A separate diad may be located between the adjacent ends of two linear conducting molecular chains. Comparing to the average electric field between the electrodes, a greater electric field exists across the small gap between the adjacent ends of two conducting molecular chains. A diad-dipole in this gap is subjected to an increased aligning torque.

5. A lepcopolymer may be assembled in situ by a proximity reaction between reactant groups on adjacent ends of a diad and the antennae.

6. A diad-dipole may comprise a preformed lepcopolymer molecule of considerable length [22] aligned as a unit. This requires a strong electric field, a nearly-insulating fluid, and sufficient dilution to provide enough space for the long molecule to align.

09 CHEMISTRY AND ELECTROOPTICS

The chemical composition and physical treatment have a profound effect on the electric and optical properties of the film. The physical treatments include stretching, solvent evaporation, temperature, time, light and electric field strength as described herein. Without diads in the film the conductivity is the same forward or reverse. The optical properties include polarization, light transmittance and reflectance at various wavelengths. With aligned diads in the film, electrical properties include forward and reverse conductivity, output electric power, current, voltage and load resistance, versus input light power and power conversion efficiency at specific wavelengths.

Criteria for the formulation of a lepcopolymer fluid were that it should be:

1. suitable for continuous casting on a manufacturing device such as shown in FIGS. 12 and 13.
2. nontoxic
3. soluble in water and/or common organic solvents
4. made of readily available commercial materials.

.09 COMPOSITIONS

Various formulae and procedures are disclosed to make light-polarizing electrically-conducting films. Experimental Results, Theoretical Chemistry and a discussion of the results is given. Such films may be used as light-electric power converters by incorporating and aligning suitable diads in the composition and assembling them with an electrode structure disclosed herein.

09.1 SYMBOLS and ABBREVIATIONS

* film color in ordinary white light
|| film color with polarized axes parallel
† film color with polarized axes orthogonal
amb amber
bl blue
bk black or opaque
cl clear or no color
br brown
dk dark
dl dull blue polarized reflection color
n neutral gray with no color
gld gold polarized reflection color
rd red
vl violet
y yellow
FN Formula No.
pa polyacetylene
pI polyiodide
pva polyvinyl alcohol
rmol relative mols compared to pva (30)=1
S/cm Siemens/cm; 1/(ohm-cm), reciprocal resistivity

09.2 PROCEDURE

Coatings of the compositions described below are formed on a suitable nonreactive surface such as Mylar by "knifing" or by dip or flow coating in known manner; for example, as shown in FIG. 13.

To remove and stretch the coating away from the Mylar Casting surface, the partially dry coating is scratched with two clean lines, one at each edge, using a suitable metal or plastic knife. The coating pulls away from the Mylar at about 10° to the surface and stretches readily. Coatings of the compositions described have a stretch-ratio of about 6, and stretch to a strong thin film which polarized light and is electrically conducting.

The properties of the pva-I-HI system were explored.

09.3 FORMULAE

| High Molecular Wght Polyvinyl Alcohol Solution | | | |
|---|---|---|---|
| | Soltn | % soltn | % Solids |
| FN A 1 | | | |
| pva Elvanol HV | 8.55 | 12.3 | 91.0 |
| Ethylene Glycol 10% | 0.85 | 1.2 | 9.0 |
| Iso propanol | 20. | 28.8 | |
| Water | 40. | 57.7 | |
| | 69.4 | 100.0 | 10. |
| FN A 2 | | | |
| pva Elvanol HV | 25.5 | 10. | 10. |
| Iso propanol | 60. | 23.4 | |
| Water | 170. | 66.6 | |
| TOTALS | 255.5 | 100.0 | 10. |

| IODINE SOLUTION | |
|---|---|
| FN B 1 | |
| 1.800 gms Iodine Crystals | 20 |
| 7.200 gms Ethanol (Anhydrol UCC Co) | 80 |
| | 100 |

Preparation of FN B 1:

Weigh iodine crystals and ethanol in a flask, stopper, heat to 72° C. in a water bath, and shake for about a ½ hr. until all crystals are dissolved.

FN B 2 same as FN B 1 with 20% n-propanol (instead of ethanol)

FN B 3 same as FN B 2 with 10% n-propanol (instead of 20% n prop)

FN C 1 Hydiodic Acid 57% water 43%.

| | SOLVENT | |
|---|---|---|
| FN S1 | Material | solution |
| | n propanol | 33 |

| | SOLVENT | |
|---|---|---|
| FN S1 | Material | solution |
| | water | 67 |
| Total | | 100 |

Solutions A, B, C an S1 are miscible with stirring to make the D solution. The D solution is then cast and stretched to produce the final product.

Examples of 18 Compositions are given; 6 in detail, and all in a table summarizing their optical and electrical characteristics.

A 1 and B 1 only are used to make:

| Polarizing Conducting Flow Coat Composition | | | | | |
|---|---|---|---|---|---|
| FN D 1 Material | % Soltn | Slds | % Slds | mol | rmol |
| FN A 1 Elvanol HV | 9.84 | 9.84 | 66.5 | 30 | 1.0 |
| Ethylene Glycol | 0.96 | 0.96 | 6.5 | | |
| FN B 1 | | | | | |
| Iodine | 4.00 | 4.00 | 27.0 | 127 | 0.096 |
| Ethanol (Anhydrol) | 16.00 | | | | |
| isopropyl alcohol | 23.00 | | | | |
| water | 46.20 | | | | |
| Totals | 100.00 | 14.80 | 100.0 | | |

% Solids 14.8
% Total Iodine 27.
Conductivity S/cm 1 E-3

FN D 1 is flow coated on a substrate, partially dried, and stretched to form a strong neutral gray polarizer with a conductivity $\sigma \approx 1$ E-3. It has a bright polarized surface reflection gold-dull blue.

A small proportion of HI added to FN D 1 causes the coating to partially dry to a darker shade in a few minutes. Stretching the coating produces an elongated film with increased strength and conductivity with light-polarizing electrically-conducting properties; its surface reflects polarized light: gold $+$, dull-blue $||$. The HI produced H+ ions, reducing polyvinyl alcohol (pva) to a somewhat crosslinked polyacetylene (pa). Crosslinking increases during drying the film at increased temperature and time, causing the film to become insoluble.

| FN D2 Material | Soltn | Soltn | Solids | % solids | mols | rmols |
|---|---|---|---|---|---|---|
| FN A 1 pva HV | 800 | | | | | |
| pva HV | | 68 | 68. | 43.2 | 30 | 1.0 |
| ethylene glycol | | 7 | 7. | 4.3 | | |
| Solvents | | 725 | | | | |
| B 1  1 Soltn | 300 | | | | | |
| iodine | | 60 | 60. | 38.1 | 127 | 0.208 |
| ethanol | | 240 | | | | |
| C 1  57% HI | 40 | | | | | |
| HI | | 22.8 | 22.8 | 14.4 | 128 | 0.078 |
| water | | 17.2 | | | | |
| Totals | 1140. | 1140. | 157.8 | 100.0 | | |

% Solids 13.8
% Total Iodine 52.5
Conductivity S/cm 1 E-3

B 1 solution is miscible with C 1 (57% HI). B 1 and C1 solutions are added slowly to the pva solution A 1 with stirring to make the FN D 2 solution. FN D 2 was knifed onto Mylar to a uniform coating, partially dried, quickly becoming dark blue-black; on stretching, the film is an electric-conductor and an excellent neutral color polarizer with about 40% transmittance, and which reflects polarized light with a bright gold color $+$ dull blue color $||$.

| FN D 3 Material | Soltn | Soltn | Solids | % solids | mols | rmols |
|---|---|---|---|---|---|---|
| FN A 1 pva HV | 700 | | | | | |
| pva HV | | 59.5 | 59.5 | 34.5 | 30 | 1.0 |
| ethylene glycol | | 6 | 6. | 3.5 | | |
| Solvents | | 634.5 | | | | |
| B 3 10% I Soltn | 500 | | | | | |
| iodine | | 50 | 50. | 29.0 | 127 | 0.20 |
| n-propanol | | 450 | | | | |
| C 1 57% HI | 100 | | | | | |
| HI | | 57 | 57. | 33.0 | 128 | 0.225 |
| water | | 43 | | | | |
| Totals | 1300. | 1300. | 172.5 | 100.0 | | |

% Solids 13.2
% Total Iodine 62.
Conductivity S/cm 2 E-2

FN D 3 is a smooth coating which was deposited on Mylar and dried for about 15 minutes to a dark amber brown color with an Optical Density $\approx 1.5$. The coating is strong and stretches to a thin polarizing film with these characteristics.

* neutral gray $||$ clear   blue-violet; polarized surface reflection: $+$ bright gold, $||$ dull.

A FN D 3 film measured: Thickness $D \approx 1$ µm; $L=3$ mm; $W=3$ mm; $R=0.5$ E 6 ohms; Conductivity $\sigma=2$ E-2.

| FN D 4 Material | Sltn | sld | % sld | mol | rmols |
|---|---|---|---|---|---|
| 1. 8.5% pva FN | 850 | 60. | 52.6 | 30 | 1.00 |
| 2. 0.85% Ethyln Gly | | 6. | 5.3 | | |
| 3. water | 280 | | | | |
| 4. 10% I/npr B4 | 280 | 28.0 | 24.0 | 127 | 0.11 |
| 5. 57% HI acid | 35 | 20. | 17.5 | 128 | 0.32 |
| Totals | 1300 | 114. | 100.0 | | |

% Solids 8.7
% Total Iodine 41.5
Conductivity S/cm 1 E-4

The FN D 4 coating was knifed onto the Mylar belt and placed in an air oven at 40° C. for about 10 min. The coating, partially dried to violet black color, was stretched with a ratio $\approx 6$. The film thickness $D \approx 5$ µm. The optical and electrical characteristics were: neutral-slight yellow * clear yellow $||$ red-black $+$; the surface reflection polarized bright gold; and the Conductivity $\sigma \approx 1$ E-4 S/cm.

There was no change in its optical or electrical properties on heating this film at 45° C. for 30 min in air oven.

Coating FN D 4 coating was still soft enough to stretch after 16 hrs at room temperature. At higher temperatures the stretching interval is critical. For example, if the film is heated to 65° C. for about 10 min it becomes insoluble and so brittle it cannot be stretched. This is evidence of crosslinking between polymer chains.

| FN D 5 Material | Sltn | sld | % sld | mol | rmols |
|---|---|---|---|---|---|
| 1. 8.5% pva FN A 1 | 755 | 64.2 | 34.2 | 30 | 1.00 |
| 2. 0.85% Ethyln Gly | | 6.4 | 3.4 | | |
| 3. water | 296 | | | | |
| 4. 10% I/npr FN B 3 | 300 | 30. | 24.6 | 127 | 0.11 |
| 5. 57% HI acid | 153 | 87. | 46.4 | 128 | 0.32 |

| FN D 5 Material | Sltn | sld | % sld | mol | rmols |
|---|---|---|---|---|---|
| Totals | 1504 | 187.6 | 100.0 | | |

% Solids 12.5
% Total Iodine 62.
Conductivity S/cm 2 E-4

FN D5 The A, B, and C solutions were added slowly with stirring. The coating on Mylar was partially dried in 3 min at 49° C. in air oven to a smooth dark amber red coating, which can be stretched in the interval 3–30 min; but for a longer time it was too brittle to stretch. *neutral yellow ∥ light-yellow † black; Conductivity: $\sigma = 2$ E-4 S/cm

| FN D 6 Material | Sltn | sld | % sld | mol | rmols |
|---|---|---|---|---|---|
| 1. 10% pva HV FN A 2 | 607 | 61 | 20 | 30 | 1.0 |
| 2. S1 Solvent | 407 | — | — | — | — |
| 3. 57% HI acid | 368 | 210 | 69 | 128 | 0.81 |
| 4. 10% I/npr B3 | 330 | 33 | 11 | 127 | 0.13 |
| TOTALS | 1712 | 304 | 100 | | |

% Solids 17.8
% Total Iodine 80.
Conductivity 1.3 E-4 S/cm

Figure 16:
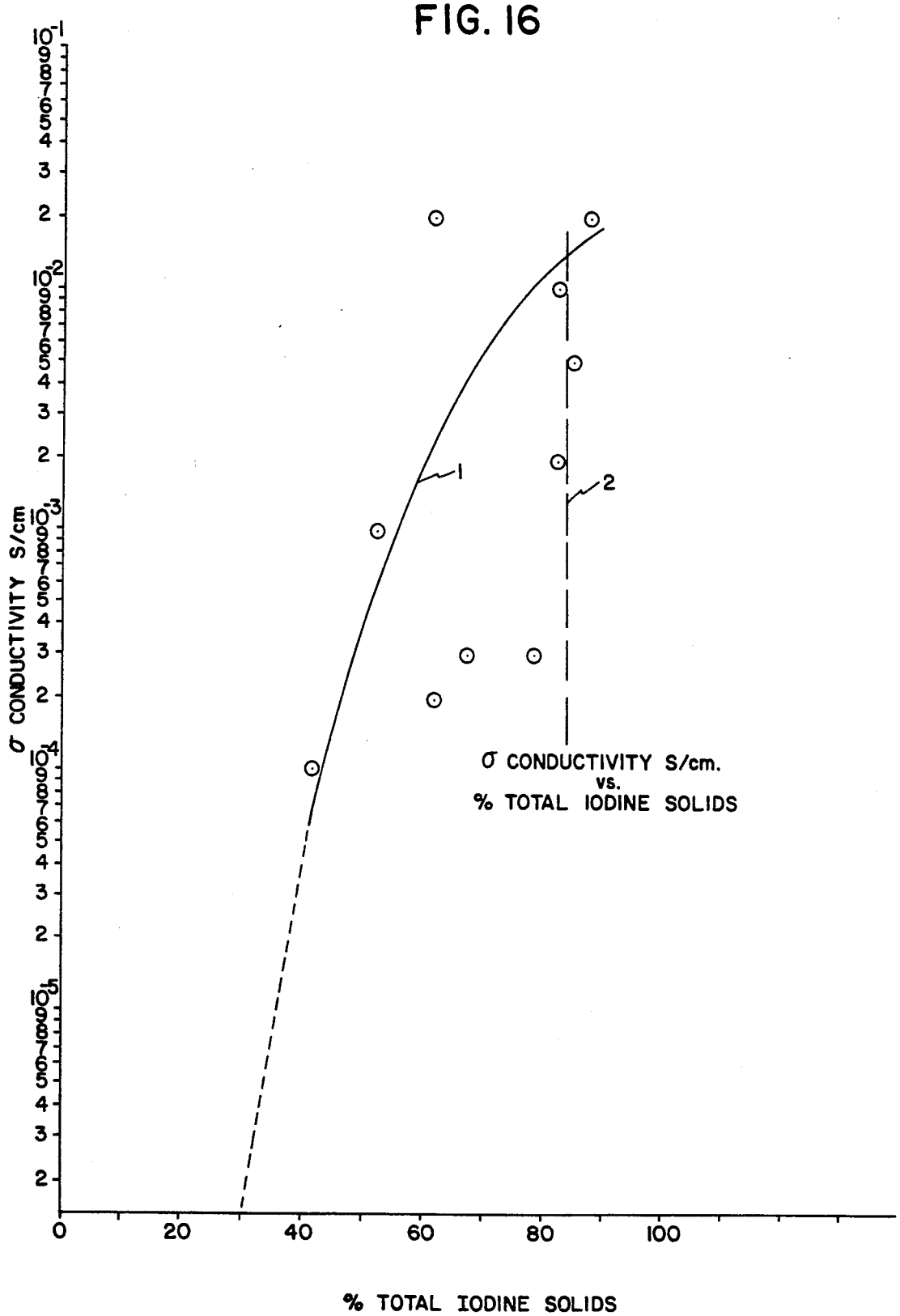
FIG. 16 is log linear graph of the Conductivity in S/cm versus the % Total Iodine Solids of a light-polarizing electrically-conducting film according to this invention.

FIG. 16 shows a log-linear plot of Conductivity $\sigma$ in S/cm vs. % Total Iodine Solids in the film for the experimental data listed in the Table. Since the HI solids are all converted to Iodine, % HI and % I are added to obtain Total % Iodine. The points are somewhat scattered, possibly because of a variation of the crosslinking. However, from about 36% to 84% Total Iodine Solids the Conductivity increases about 3 orders or magnitude, or 1000 times. A limit is reached at about 84% where the conductivity suddenly decreases.

09.4 EXPERIMENTAL RESULTS

EXPERIMENTAL RESULTS
Characteristics of Light Polarizing Electrically Conducting Films

| FN | Sld % | I % | Relative Mol | | | Color and Polarization | | | | Conductvty $\sigma$ S/cm |
|---|---|---|---|---|---|---|---|---|---|---|
| | | | pva | I | HI | ctg | * | ∥ | † | |
| 1 | 15 | 27 | 1 | 0.1 | 0.0 | blbk | n | cl | bk | — |
| 2 | 14 | 53 | 1 | 0.2 | .08 | bk | n | cl | bk | 1 E-3 |
| 3 | 13 | 62 | 1 | 0.2 | .23 | dkbr | n | cl | blvl | 2 E-2 |
| 4 | 9 | 42 | 1 | 0.1 | .08 | rdbk | ny | clbr | rdbl | 1 E-4 |
| 5 | 13 | 62 | 1 | 0.1 | .32 | amrd | ny | cly | bk | 2 E-4 |
| 6 | 18 | 80 | 1 | 0.1 | .81 | | | | | 1 E-4 |
| 7 | 23 | 88 | 1 | 1.6 | .13 | amrd | n | cl | blbk | 2 E-2 |
| 8 | 19 | 82 | 1 | 0.1 | 1.0 | am | n | cl | bk | 2 E-3; 1 E-2 |
| 9 | 21 | 79 | 1 | .08 | 0.8 | dkbr | n | cl | bk | 3 E-4 |
| 10 | 18 | 67 | 1 | .07 | 0.5 | dkam | n | cl | bk | 3 E-3 |
| 11 | 12 | 85 | 1 | .09 | 1.2 | dkbr | n | cl | rdbk | 5 E-3 |
| 12 | 26 | 89 | 1 | .25 | 1.7 | br | n | cl | bk | 1 E-3 |
| 13 | 21 | 89 | 1 | .24 | 1.7 | dkbr | n | cl | rdbk | 7 E-4 |
| 14 | | | | | | | | | | |
| 15 | | | | | | | | | | |
| 16 | | | | | | | | | | |
| 17 | | | | | | | | | | |
| 18 | | | | | | | | | | |
| 19 | | | | | | | | | | |

09.5 THEORETICAL CHEMISTRY

Dissolved iodine reacts with water to produce an acid such as HI which provides H+ ions. Additional HI further drives the reaction. The composition appears to be a polyvinyl alcohol-polyacetylene-polyiodide copolymer having the formula:

$$(CHOH)_x(CH)^+{}_{1-x}I^-{}_{1-x}I_y \quad (1)$$

Polyacetylene (pa) is poly(—CH=). Various methods of making pa doped with Iodine are described, [14,15] in which it was shown that Iodine exists along the conjugate carbon chain as:

$$I_3{}^- \text{ and } I_5{}^- \quad (2)$$

Composition of $HI_3$[31]:

$$HI + 2I = H^+ + I_3{}^- \quad (3)$$

$$HI = 1 + 127 = 128$$

$$\begin{array}{rl} 57\% \text{ HI} & = 224.6 \times 0.57 = 128. \\ \underline{43\% \text{ water}} & \underline{= 224.6 \times 0.43 = 96.6} \\ & \text{TOTAL 224.6} \end{array}$$

$$\begin{array}{rl} HI & = 1 + 127 = 128. \\ \underline{2I} & \underline{= 2 \times 127 = 254} \\ & \text{TOTAL 382} \end{array}$$

Composition of $HI_5{}^-$:

$$HI + 4I = H^+ + I_5{}^- \quad (4)$$

$$\begin{array}{rl} 4I & = 4 \times 127 = 508 \\ \underline{HI} & \underline{= \phantom{4 \times 127 =} 128} \\ & \text{TOTAL 636} \end{array}$$

Reactions (3) and (4) produce H+ ions which react in solution with the OH groups along the pva chain. The reaction products are water and singly ionized linear polyiodide molecules comprising 3 or 5 iodine atoms. The singly ionized linear polyiodide atoms are held by (dope) the pa chains according to this reaction:

$$(HCOH)_x + xH^+ + xI_y{}^- \rightarrow (CH)_x + xH_2O + xI_y{}^- \quad (5)$$

where:

$$y = 3, 5 \quad (6)$$

and, where $$I_5{}^- \rightarrow I_3{}^- + I_2 \quad (7)$$

In the reaction (5) H+ ions from the HI react with pva to produce pa; iodine is liberated and becomes available for forming a negatively ionized polyiodide chain.

Polyiodide ions having $y=5$ are available for doping the pa chain with singly ionized polyiodide molecules. Reaction (5) produces pa which is a linear conjugate carbon chain. However, crosslinking of the chains also occurs forming two dimensional interchain linkages with oxygen bridges: C—O—C.

A break in the electrical conduction occurs at these interchain linkages, because the electrically-conducting conjugate bonds:

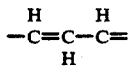

are converted to oxygen crosslinked aliphatic bonds

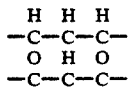

which are insulating. Crosslinking is inferred because the coating and the stretched film become insoluble on heating; and, a newly prepared partially dried film forms a hard intrinsic bond with a glass surface on which it is placed by the formation of oxygen bonds between the polymer carbon chains and the silica chains in the glass. Occasional crosslinkages may explain the smaller conductivity and somewhat scattered conductivity values measured herein. The % of carbon atoms along the chain which are crosslinked varies with control factors to which the coating and the film are subjected. Chemical composition, temperature, time, fast drying solvents, surface air velocity for drying the film, are control factors. The Conductivity of the film can be increased by minimizing the crosslinking by a choice of control factors; for example, by using a shorter drying time, lower temperature, faster drying solvent and increasing residual solvent evaporation with a suitable surface air velocity.

The literature reports crystalline polyacetylene-polyiodine with a Conductivity as large as 1000 S/cm. [13,14] The greatest values reported herein are about 1 E-2 S/cm; a factor of 1 E 5 smaller. However, for light-electric power conversion it is shown herein that a conductivity of about 1 E-6 S/cm is sufficient. The present compositions have a conductivity 100 or 1000 greater than is needed for this application.

The reaction (5) produces random lengths of conducting and nonconducting polymers on the same chain or on parallel chains; interspersed with polyiodide chains attached to both pva and pa. The polyiodide chains provide additional conductive paths, and tunneling provides electrical continuity. This structure constitutes a percolation system of random conductors in an insulating matrix comprising parallel chains of pva, pa and pI.

09.6 DISCUSSION OF RESULTS

1. Crystalline polyacetylene without iodine has a low conductivity of about 1 E-5 S/cm. When it is doped with about 20% iodine solids the conductivity increases to more than 1000 S/cm or 1 E 5 S/cm.

2. Compositions disclosed herein comprise solutions of Polyvinyl Alcohol, Hydroiodic Acid and Iodine coated on a substrate and stretched when partially dried, to make an excellent light-polarizing film with a conductivity of at least 1 E-4 S/cm. A coating of this composition may be stretched with as little as 12% initial pva in the solids. Apparently polyacetylene (mol=13) and polyiodide (mol=127) has been formed. The equimolar ratio of polyacetylene and iodine is: (CH)/(I) = 13/127 = 0.102.

3. The stretch-oriented film appears to be a copolymer of polyvinyl alcohol, polyacetylene and polyiodide with a small proportion of crosslinks. In reacting with the OH groups on the pva, the HI may be entirely converted to I and water. In such case the greatest proportion of the solids comprises iodine as polyiodide chains, which are stabilized by stretch orientation and crosslinking of the polymer chains.

4. In compositions where the molar ratio of Polyvinyl Alcohol to Hydroiodic Acid is 1/1 or more, conversion of the Polyvinyl Alcohol to Polyacetylene should be substantially complete, but the conductivity is too small for this to be so. The decreased conductivity appears to be due to crosslinkages between the chains, which convert conducting conjugate carbon chains to nonconducting aliphatic-type linkages.

5. The stretch oriented films disclosed herein should have a much greater Conductivity: 1 E 3 S/cm: but only about 1 E-3 S/cm is obtained.

6. A film with a greater % crosslinking is more insoluble, and has a smaller conductivity. A film having a high conductivity requires that a smaller proportion of conjugate carbon atoms along the polymer chain be crosslinked.

7. The proportion of conjugate carbon atoms along the chain which are crosslinked depends on factors which may be controlled, including reactant concentration, residual solvent, temperature, surface air velocity, and time.

8. For high efficiency light-electric power conversion the polymeric film must have a conductivity of at least 1 E-6 S/cm.

9. The composition and processes disclosed herein may be used to produce light-polarizing, electrically conductive films having a conductivity of about 1 E-3, or more, which is 1000 times greater than the 1 E-6 S/cm required for high efficiency light-electric power conversion. The exact Conductivity required may be obtained by a suitable proportion of polyvinyl alcohol, polyacetylene and polyiodide in the copolymer; or by varying the proportion of crosslinkages between the chains.

10. To make a film which converts light to electric power with high efficiency suitable Diads are incorporated in the film, and aligned by an electric field while illuminated.

11. After stretching the partially dry films adhere to a glass by a C—O—Si crosslinking chemical bond, useful for bonding the film as a surface layer.

12. Films with a high Iodine content, initially a neutral color, become redder and conductivity decreases with time in a humid atmosphere. On exposing these films for about 30-60 sec to saturated vapor or liquid water at about 20° C. the films again become * neutral gray || clear † blbk. The transmittance is high, about 45%, and crossed polarizers have excellent extinction. The gold reflection changes to dull bronze, or nearly zero reflectance.

There has been disclosed herein a light-polarizing electrically-conducting film and its application to light-electric power conversion. Other applications include, for example: displays utilizing transparent conducting films and polarizers, the disclosed film performing both functions; and, heated antifogging nonglare windows. The chemical and mathematical physical theory, composition, electrooptical properties, structure, process for manufacture, and manufacturing equipment are disclosed. It will be understood that many other conducting polymers [13,14,15,17,23], dopants [13,14] and diads [2,19,20,21,22] are known and described in the literature. The disclosures made herein are illustrative, and may be varied without departing from the scope of this invention; and, I do not wish to be limited thereby.

10. REFERENCES

[1] Marks, A. M. U.S. Pat. No. 4,574,161 issued Mar. 4, 1986 "Ordered Dipolar Light-Electric Power Converter",
Definition of Lepcomer, Col. 1, lines 42–46,
Head to Tail Orientation of dipoles by light and electric field, Col. 5, lines 65–69 and Col. 6, lines 1–66

[2] Warman, J. M., "Photosynthesis: A Quantum Jump for Chemistry", Nature, Vol. 327, pp 462–464, Jun. 11, 1987

[3] Ambronn, Hermann and Frey Wyssling "Das Polarization Mikroskop", Book, 1925

[4] Marks A. M. and Weiss, G., and Miller, A. R., U.S. Pat. No. 2,432,113, issued Dec. 9, 1947, "Method of Impregnating a Polyvinyl Polarizing Sheet with Tetraethylorthosilicate"

[5] Land, E. H., U.S. Pat. No. 2,173,304, Sep. 19, 1939

[6] Land, E. H. and West, C. D., Dichroism and Dichroic Polarizers, Chapter 6, Vol. 6 of Colloid Chemistry ed. Jerome Alexander, 1946, Rheinhold Publishing Co., N.Y.

[7] Pamphlet, "K Polarizing Film Material", Polaroid Corp., Cambridge, Mass., 1938

[8] Marks, A. M., "Machine for the Continuous Casting of Films Directly from Solution", U.S. Pat. No. 2,897,544, issued Aug. 4, 1959

[9] Marks, A. M.; Marks, M. M., "Film Casting Apparatus", U.S. Pat. No. 3,263,272, issued Aug. 2, 1966

[10] Marks, A. M., "Casting Composition for Light Polarizing Films", U.S. Pat. No. 3,300,426, issued Jan. 24, 1967

[11] Hatano, M., Kambaro, S., and Okamoto, S. (1961) J. Polymer Sci 526

[12] R. Zallen, The Physics of Amorphous Solids, John Wiley, New York, 1983, Chapters 4 and 5

[13] Ferraro and Williams, Introduction to Synthetic Electrical Conductors, Chapter 3, "Conductive Organic Polymers", pages 88–138, 1987, Academic Press Inc, N.Y.

[14] Chien, James C. W., Polyacetylene, Chemistry, Physics and Material Science, Academic Press, New York, 1984

[15] Alejandro, Andreatta, S. Tokito, P. Smith and A. J. Heeger, "Fibers of Conducting Polymers: High Electrical Conductivity Combined with Attractive Mechanical Properties", Office of Naval Research (N00014-83-K-0450), National Science Foundation (NSF-DMR87-03399), and DARPA-AFOSR Contract No. F49620-88-C-0130

[16] Burroughes, Jones & Friend, "New Semiconductor Device Physics in Polymer Diodes and Transistors", Nature, Vol. 335 8 September 1990, pp 137–141

[17] Kivelson, S. and Heeger A. J., "Intrinsic Conductivity of Conducting Polymers", Synthetic Metals 22 (1988) pp 371–384

[18] Fabian, J. and Hartmann, H., Light Absorption of Organic Colorants, Theoretical Treatment and Empirical Rules with 76 Figures and 48 Tables, 1980, Springer Verlag, New York

[19] Griffiths, John Colour and Constitution of Organic Molecules, 1976, Academic Press, New York
Chapter 6, Donor Acceptor Chromogens,
p. 141, Table 6.1 Relative Effectiveness and Ionization Potential of some Electron Donor Groups,
p. 145, Table 6.2, Relative Effectiveness and Hammett $\sigma$-Constants of some Electron Acceptor Groups

[20] M. R. Wasielewski and M. P. Niemezyk, "Distance Dependent Rates of Photoinduced Charged Separation and Dark Charge Recombination in Fixed Distance Porphyrin-Quinone Molecules", Chemistry Division, Argonne National Laboratory, Argonne, Ill. 60439, C 0097-6156/86/0321-0154, 1986, American Chemical Society

[21] M. N. Paddon-Row, A. M. Oliver, J. R. Warman, K. J. Smit, M. P. de Haas, H. Oevering, and J. W. Verhoeven, "Factors Affecting Charge Separation and Recombination in Photoexcited Rigid Donor-Insulator-Acceptor Compounds", pages 6958–6962, The Journal of Physical Chemistry, 1988

[22] D. Gust, T. A. Moore, S-J Lee, E. Bittersman, D. K. Luttrul, A. A. Rehms, J. M. De Graziano, X. C. Ma, F. Gao, R. E. Belford, T. T. Trier, "Efficient Multistep Photoinitiated Electron Transfer in a Molecular Pentad", Reports, pages 199–201, Science, Vol. 248 13 Apr. 1990

[23] S. Tokito, P. Smith, A. J. Heeger, "Highly Conductive and Stiff Fibres of Poly(2,5-dimethoxy-p-phenylenevinylene) (PDMPV) Prepared form Soluble Precursor Polymers", Institute for Polymers and Organic Solids, University of California at Santa Barbara, Santa Barbera, Calif., supported by Office of Naval Research N00014-83-0450; 1984

[24] J. D. Kraus, pages 41–52, ANTENNAS, McGraw Hill Book Co., New York, 1950

What I wish to claim is:

1. An electrically conductive sheet comprising:
   a transparent resin sheet;
   said sheet having been unidirectionally stretch oriented
   a first plurality of conductors in said sheet;
   said first plurality of conductors having been drawn into a generally parallel relationship while said sheet was oriented;
   a proportion, less than all, of said first plurality of conductors contacting others of said first plurality of conductors;
   a second plurality of gaps in said first plurality of conductors;
   a third plurality of connections across said second plurality of gaps; and
   said third plurality of connections being in sufficient proportion to said second plurality of gaps to provide an electric current flow between first and second points spaced apart in a direction of orienting of said sheet.

2. An electrically conducting sheet according to claim 1, wherein a plurality of said gaps are about 20 Å, whereby said electric current flows at least in part by tunnelling through said gaps.

3. An electrically conducting sheet according to claim 1, in which said first plurality of conductors comprise an antenna array; said antenna array having dimensions and spacing effective to resolve incident photons and about half are transmitted and polarized.

4. An electrically conducting sheet according to claim 1, wherein said connections are diodes having a substantially unidirectional current flow in a head to tail direction, a plurality of said diodes being located at said gaps and aligned parallel to a direction of flow of said electric current, whereby an electric current flows only in said head to tail direction.

5. An electrically conducting sheet according to claim 3, in which said conductors are linear conducting polymer molecules and in which said matrix is an insulating linear polymer, said polymers comprising a film.

6. An electrically conducting sheet according to claim 5, in which said film has an electrical conductivity of at least $10^{-7}$ S/cm.

7. An electrically conducting sheet according to claim 4, in which said conductors are linear conducting polymer molecules, and in which said diodes are diads.

8. An electrically conducting sheet according to claim 7, in which said diads are molecular donor acceptor complexes.

9. An electrically conducting sheet according to claim 5, in which said linear conducting polymer molecules are oriented along said axis, means for orienting said diad molecules in said sheet, said diads being oriented by said means head to tail parallel to said electric current flow, whereby said electric current flow is substantially unidirectional, and about half of incident photons are transmitted and polarized.

10. An electrically conducting sheet according to claim 1, further comprising a second sheet, the first mentioned sheet comprising a film of polymer stretch-oriented along an axis, said second sheet being transparent, said first sheet being supported on said second sheet, said first sheet being an electrical conductor and antenna array, whereby about half of photons incident on said polymer film are transmitted and polarized.

11. An electrically conducting sheet according to claim 1, wherein said third plurality of connections each includes a diad.

12. An electrically conducting sheet according to claim 11, wherein a polarity of said diad is controlled, whereby unidirectional current flow is permitted.

13. An electrically conducting sheet according to claim 1, further comprising:
a first conductor passing across said sheet normal to a direction of said first plurality of conductors and passing through said first point;
a second conductor passing across said sheet normal to said direction of said first plurality of conductors and passing through said second point; and
means for connecting said first and second conductors to said first plurality of conductors, whereby an electric current is enabled to pass between said first and second conductors through said first plurality of conductors.

14. An electrically conducting sheet according to claim 1 wherein:
said sheet polarizes incident light, and permits a proportion, less than half, of said incident light to pass through said sheet; and said proportion is strongly polarized.

15. A photoelectric device comprising:
a generally transparent light transmitting sheet
said sheet including means for polarizing light
said means for polarizing, in combination with said sheet, being effective to transmit therethrough a transmitted beam containing a substantial proportion, less than half, of light incident thereon;
said transmitted beam being polarized;
said sheet being a stretch oriented linear polymer and further including means for at least one of a) generating electricity in response to incident light and 2) producing light in response to electric input; and
means for electrical connection to said photoelectric device whereby electricity may be conducted to and from said device.

16. A device according to claim 15, further comprising a second photoelectric device identical to the photoelectric device in claim 15, and said second photoelectric device being stacked parallel to the photoelectric device of claim 15 and rotated in a direction having a polarization vector perpendicular to a polarization vector of said transmitted beam, whereby, the two photoelectric devices, in combination, absorb substantially all of said incident light.

17. Apparatus comprising:
a first plastic resin sheet;
first and second conductive electrodes having first ends connected to said first bus bar and extending toward said second bus bar;
a first plurality of conductive electrode having first ends connected to said first busbar and extending toward said second bus bar;
a second plurality of conductive electrode shaving first ends connected to said second busbar; and extending toward said first bus bar;
said first and second conductive electrodes being interdigitated with a predetermined distance between each of said first plurality of conductive electrodes and its neighboring second plurality of conductive electrodes;
a second plastic resin sheet;
said second plastic resin sheet including a surface layer having a plurality of generally parallel linear conductors thereon;
some of said linear conductors making electrical contact with others of said linear conductors, whereby a two dimensional matrix of linear conductors is formed;
a plurality of gaps in said linear conductors;
a substantial number of said gaps being bridged by diodes;
said first and second pluralities of conductive electrodes contacting said linear conductors, whereby electricity is connectable between said linear conductors and said first and second bus bars; and
those of said diodes between each of said first conductive electrodes and one of its neighbors being polarized in the same direction, whereby unidirectional flow of electric current is enabled.

18. An apparatus according to claim 17, wherein said diodes are diads.

19. An apparatus according to claim 17 further comprising breaks in said first bus bar.

* * * * *